United States Patent [19]
Levin et al.

[11] Patent Number: 5,955,910
[45] Date of Patent: *Sep. 21, 1999

[54] SWITCH WITH PROGRAMMABLE DELAY

[75] Inventors: Gedaly Levin, Acton, Mass.;
Christopher J. Sanzo, Cranston, R.I.;
Arthur R. Theroux, West Warwick,
R.I.; George E. Schuellein,
Narragansett, R.I.

[73] Assignee: Cherry Semiconductor Corporation,
East Greenwich, R.I.

[ * ] Notice: This patent is subject to a terminal disclaimer.

[21] Appl. No.: 09/132,511

[22] Filed: Aug. 11, 1998

Related U.S. Application Data

[63] Continuation of application No. 08/682,153, Jul. 17, 1996, Pat. No. 5,841,313
[60] Provisional application No. 60/002,941, Aug. 30, 1995, provisional application No. 60/007,766, Nov. 30, 1995, and provisional application No. 60/012,754, Mar. 4, 1996.

[51] Int. Cl.$^6$ .............................. H03K 17/296; G05F 1/40
[52] U.S. Cl. ......................... 327/393; 327/280; 327/266; 327/113; 327/27; 323/266; 363/89
[58] Field of Search ................................ 327/27, 113, 24, 327/266, 276, 278, 280, 393; 323/266; 363/89

[56] References Cited

U.S. PATENT DOCUMENTS

| | | | |
|---|---|---|---|
| 3,743,860 | 7/1973 | Rossell | 327/452 |
| 3,778,581 | 12/1973 | Denny | 219/85.18 |
| 3,990,000 | 11/1976 | Digneffe | 323/322 |
| 3,992,638 | 11/1976 | Sauvanet | 327/452 |
| 4,030,015 | 6/1977 | Herko et al. | 363/16 |

(List continued on next page.)

FOREIGN PATENT DOCUMENTS

| | | |
|---|---|---|
| 0 047 955A2 | 3/1982 | European Pat. Off. . |
| 58-20026 | 2/1983 | Japan . |
| 1-157612 | 6/1989 | Japan . |

OTHER PUBLICATIONS

"Design Techniques for Synchronous–Switch Post Regulators", Cliff Jamerson et al., 10 HFPC May 1993 Proceedings.

"Precision Switchmode Pulse Width Modulator Control Circuits", Motorola Semiconductor Technical Data, pp. 3–231—3–242.

"A New Integrated Circuit for Current–Mode Control", Power Concepts, Inc. Powercon 10, Mar. 22–24, 1983, San Diego, CA, pp. 83–91.

"Voltage Regulators" Product Description, Fairchild, Jan. 1982, pp. 2–102—2–108.

"Designing with a New Secondary Side Post Regulator (SSPR) PWM Controller for Multiple Output Power Supplies", Gedaly Levin, PCIM '95, Nürenberg, Germany, Jun. 20–22, 1995.

CS5101 Product Objective Specification dated Jun. 28, 1994 (Mar. 1994 APEC Conference).

"A New Secondary Side Post Regulator (SSPR) PWM Controller for Multiple Output Power Supplies", Gedaly Levin, APEC Conference, Mar. 5–9, 1995.

SSPR Block Diagram, Cherry Semiconductor Corporation, APEC Conference, Mar. 5–9, 1995.

Cherry Semiconductor Corporation Schematic CS310, dated Oct. 25, 1985.

*Primary Examiner*—Terry D. Cunningham
*Assistant Examiner*—Terry L. Englund
*Attorney, Agent, or Firm*—Bromberg & Sunstein LLP

[57] ABSTRACT

A programmable delay circuit employs a comparator to control an output driver. The comparator compares a ramp signal to an error control signal derived from an error amplifier or in the alternative to a disable signal. The output of the comparator is latched on until a reset signal is received. The reset signal is produced when the ramp signal is discharged below a predetermined level. The programmable delay circuit is useful in a secondary side post regulator to control a totem pole driver. The totem pole driver in turn controls a switching device coupled to a voltage on a secondary winding.

27 Claims, 14 Drawing Sheets

U.S. PATENT DOCUMENTS

| | | | |
|---|---|---|---|
| 4,247,751 | 1/1981 | Ashton et al. | 219/130.31 |
| 4,255,715 | 3/1981 | Cooperman | 330/9 |
| 4,276,548 | 6/1981 | Lutz | 342/103 |
| 4,333,490 | 6/1982 | Enter, Sr. | 137/78.3 |
| 4,425,548 | 1/1984 | Kage | 327/166 |
| 4,508,979 | 4/1985 | Togari | 327/256 |
| 4,538,101 | 8/1985 | Shimpo et al. | 323/272 |
| 4,614,899 | 9/1986 | Webb et al. | 315/411 |
| 4,633,381 | 12/1986 | Upadhyay | 363/56 |
| 4,638,176 | 1/1987 | Martinelli | 307/64 |
| 4,651,678 | 3/1987 | Kime | 54/71 |
| 4,672,332 | 6/1987 | Coccetti et al. | 331/111 |
| 4,684,824 | 8/1987 | Moberg | 326/82 |
| 4,733,104 | 3/1988 | Steigerwald et al. | 327/176 |
| 4,739,198 | 4/1988 | Maruyama | 327/52 |
| 4,740,742 | 4/1988 | Gontowski, Jr. | 323/313 |
| 4,802,077 | 1/1989 | Fujii et al. | 363/41 |
| 4,823,070 | 4/1989 | Nelson | 323/285 |
| 4,849,651 | 7/1989 | Estes, Jr. | 307/125 |
| 4,853,837 | 8/1989 | Gulczynski | 363/80 |
| 4,882,664 | 11/1989 | Pennington | 363/41 |
| 4,884,165 | 11/1989 | Kong et al. | 361/98 |
| 4,887,022 | 12/1989 | Gontowski | 323/284 |
| 4,975,823 | 12/1990 | Rilly et al. | 363/56 |
| 5,023,481 | 6/1991 | Tero et al. | 327/488 |
| 5,075,839 | 12/1991 | Fisher et al. | 363/48 |
| 5,079,453 | 1/1992 | Tisinger et al. | 327/132 |
| 5,099,138 | 3/1992 | Fukunaga | 327/109 |
| 5,111,133 | 5/1992 | Poulo et al. | 323/286 |
| 5,119,284 | 6/1992 | Fisher et al. | 363/48 |
| 5,132,891 | 7/1992 | Kobayashi et al. | 363/21 |
| 5,142,217 | 8/1992 | Gontowski, Jr. | 323/272 |
| 5,164,657 | 11/1992 | Gulczynski | 323/275 |
| 5,173,849 | 12/1992 | Brooks | 363/127 |
| 5,182,472 | 1/1993 | Ando | 326/110 |
| 5,221,887 | 6/1993 | Gulczynski | 323/285 |
| 5,225,767 | 7/1993 | Gulcyznski | 323/268 |
| 5,233,603 | 8/1993 | Takeuchi et al. | 370/412 |
| 5,237,606 | 8/1993 | Ziermann | 379/413 |
| 5,281,862 | 1/1994 | Ma | 327/108 |
| 5,291,382 | 3/1994 | Cohen | 363/16 |
| 5,311,150 | 5/1994 | Engbretson et al. | 331/59 |
| 5,321,596 | 6/1994 | Hurst | 363/8 |
| 5,325,258 | 6/1994 | Choi et al. | 361/87 |
| 5,329,175 | 7/1994 | Peterson | 326/85 |
| 5,335,014 | 8/1994 | Elberbaum | 348/159 |
| 5,365,118 | 11/1994 | Wilcox | 327/109 |
| 5,367,247 | 11/1994 | Blocher et al. | 323/222 |
| 5,371,552 | 12/1994 | Brummette et al. | 348/697 |
| 5,373,217 | 12/1994 | Gregor | 315/248 |
| 5,408,150 | 4/1995 | Wilcox | 327/108 |
| 5,424,932 | 6/1995 | Inou et al. | 363/21 |
| 5,425,017 | 6/1995 | Copley et al. | 370/245 |
| 5,436,583 | 7/1995 | Fujii et al. | 327/165 |
| 5,438,278 | 8/1995 | Wong et al. | 326/27 |
| 5,444,359 | 8/1995 | Riggio | 323/237 |
| 5,444,695 | 8/1995 | Copley et al. | 370/452 |
| 5,450,019 | 9/1995 | McClure et al. | 326/28 |
| 5,502,610 | 3/1996 | Chaney | 361/18 |
| 5,508,664 | 4/1996 | Rizzo | 331/111 |
| 5,508,906 | 4/1996 | Nelli et al. | 363/97 |
| 5,519,357 | 5/1996 | Eddlemon | 330/264 |
| 5,592,128 | 1/1997 | Hwang | 331/61 |
| 5,608,346 | 3/1997 | Giebel | 327/382 |
| 5,627,460 | 5/1997 | Bazinet et al. | 323/288 |
| 5,642,027 | 6/1997 | Windes et al. | 320/166 |
| 5,742,491 | 4/1998 | Bowman et al. | 363/21 |
| 5,757,210 | 5/1998 | Sanzo | 327/63 |
| 5,781,058 | 7/1998 | Sanzo et al. | 327/387 |
| 5,793,241 | 8/1998 | Sanzo et al. | 327/323 |
| 5,805,401 | 9/1998 | Schuellein et al. | 361/92 |
| 5,841,641 | 11/1998 | Faulk | 363/53 |

SWITCH WITH PROGRAMMABLE DELAY

The present application is a continuation of U.S. patent application Ser. No. 08/682,153, filed Jul. 17, 1996 (now U.S. Pat. No. 5,841,313 issused Nov. 24, 1998), which claims priority from U.S. Provisional Patent Application No. 60/002,941, filed Aug. 30, 1995, U.S. Provisional Patent Application No. 60/007,766, filed Nov. 30, 1995 and U.S. Provisional Patent Application No. 60/012,754, filed Mar. 4, 1996. The full disclosures of all of the aforementioned applications being hereby incorporated by reference herein.

BACKGROUND OF THE INVENTION

The present invention relates to a switch with programmable delay, in particular, an integrated circuit for use as a secondary side post regulator PWM (pulse width modulator) controller.

There are a number of post regulator methods for power control in a multiple output power regulator. The most popular in the mid to high power range are magnetic amplifiers. The magnetic amplifiers permit circuitry with low component count and simple thermal management. At low and medium frequencies, the magnetic amplifiers are cost competitive. However, at high frequencies, the suitable magnetic amplifiers become much more expensive. Problems are also often encountered with magnetic amplifiers in terms of overcurrent or turn off protection.

A leading edge modulated synchronous switch post regulator is the semiconductor equivalent of the magnetic amplifier post regulator. The need for a synchronous switch post regulator integrated circuit has existed for quite some time. Cliff Jamerson and Tony Long in their article "Design Techniques for Synchronous-Switch Post Regulators", *HFPC May* 1993 *Proceedings,* specifically urged the development of such an integrated circuit to reduce the parts count associated with this regulation technique. One object of the present invention is to fill this need.

SUMMARY OF THE INVENTION

The present invention is directed to a switch with programmable delay, sometimes referred to herein as an SSPR switch. The switch includes an error amplifier for receiving a voltage sense signal and a reference signal. The error amplifier is used to produce an error control signal. A comparator receives the error control signal and uses it to determine when to turn the switch on. The error control signal is compared to a voltage signal from a timing capacitor. The switch includes a current for charging the capacitor and a switchable discharge path for discharging the capacitor. In accordance with an embodiment of the invention, the timing capacitor begins charging upon occurrence of a first edge of a sync signal. For secondary side regulation, the sync signal corresponds to the voltage on the secondary winding. The comparator turns the switch on by generating a first state signal when the voltage signal from the capacitor exceeds the error control signal from the error amplifier. A latch is connected to the comparator to latch the first state signal on. The comparator remains latched until a reset signal is received. A reset signal generator produces a reset signal when the timing capacitor is discharged below a predetermined level. The switch includes an output driver which is switched on in response to the first state signal and is switched to provide a low impedance path between a first terminal and a second terminal in response to the second state signal.

In accordance with an embodiment of the invention, the reset signal is only generated when both the sync signal and the voltage on the timing capacitor have fallen below their respective predetermined levels to indicate that they have been discharged. It is desirable to avoid switching the output to the low impedance state while the sync signal is high. For a secondary side post regulator, the output of the SSPR switch of the invention is connected to the gate and source of a FET. An input terminal of the SSPR switch is also connected to the drain of the FET. The drain of the FET is connected to receive SYNC voltage on the secondary winding. In accordance with the present invention, a grounded totem pole driver is the output driver of the SSPR switch. While the FET is being driven, the source of the FET rises towards the drain of the FET. As such, if the bottom output transistor of the totem pole driver were turned on in the middle of a pulse, a large current would be pulled out from the source to gate circuit of the FET down to ground. To avoid subjecting the FET to the danger of such a current, the reset signal is only issued when the voltage on the secondary winding is down to a safe predetermined level.

In accordance with another embodiment of the invention, an overcurrent limit is provided by the use of a current sense amplifier. If the current output by the secondary side post regulator exceeds a limit programmed at the inputs of the current sense amplifier, the current sense amplifier overrides the error amplifier. The current sense amplifier sinks the current from the error control signal. The inputs to the comparator are arranged so that under these conditions, the error control input to the comparator is a high signal. The capacitor at the ramp terminal is unable to charge above the error control input and the comparator is thus disabled and prevented from switching the output on.

In accordance with another embodiment of the invention, the ramp terminal for connection to the external timing capacitor may be used to put the switch into a sleep mode. The capacitor normally charges and discharges between predetermined limits. A discharge clamp is provided in an embodiment of the invention to set a lower limit on the voltage of the timing capacitor to which the discharge circuit can pull the capacitor. If the ramp terminal is forced to a sleep threshold below this discharge level by an external means, sleep mode circuitry disables the SSPR switch. According to an embodiment of the invention, the SSPR switch includes an undervoltage lockout circuit. The undervoltage lockout circuit disables the switch if the supply voltage to the integrated circuit falls below a disable threshold level. A sleep terminal, or multiple function terminal implementing the sleep function, may be connected to the undervoltage lockout circuit so that bringing the terminal below the predetermined sleep threshold will cause the undervoltage lockout circuit to disable the integrated circuit. In accordance with a still further embodiment of the invention, the SSPR switch may include an undervoltage lockout circuit with hysteresis. As such, the undervoltage lockout circuit is required to enable the circuit once the supply voltage exceeds an enable threshold and to disable the integrated circuit when the supply voltage falls below a disable threshold, lower than the enable threshold.

In accordance with a still further embodiment of the invention, an emergency voltage supply ensures that the output driver is in a low impedance state when the integrated circuit is not powered, is in sleep mode or is in undervoltage lockout. This protection is particularly required when there is a voltage present at the drain of the external FET. Thus, in accordance with an embodiment of the invention, the drain of the FET itself serves as the emergency voltage supply.

In accordance with a still further embodiment of the invention, the internal switching logic of the SSPR switch is disabled when either the supply voltage or the regulated voltage falls below its respective threshold. When either of these faults is detected, the timing capacitor on the ramp terminal is discharged to prevent the output driver from being switched on by the comparator.

The switch with programmable delay of the invention may be used in a secondary side post regulator. The secondary side post regulator is characterized in that it receives a sync signal corresponding to a voltage on a secondary winding. A switching device has an input coupled to the voltage on the secondary winding, a control input and an output. A programmable delay circuit controls a grounded totem pole driver which controls the switching device through its control input. The switching device is floating, in other words, it is not grounded. The grounded totem pole driver is switched between driving an output signal through the control input of the switching device and providing a low impedance path from the control input to ground. The programmable delay circuit maintains the low impedance path through the totem pole driver until completion of a programmable delay following a first edge of the sync signal. The programmable delay after the first edge is determined by a sense signal corresponding to the voltage at the output of the switching device. Upon completion of the delay, the output signal is driven by the totem pole driver. The low impedance path to ground is restored in the totem pole driver shortly after a second edge of the sync signal. In accordance with the present invention, a floating FET is driven by a grounded totem pole driver.

Several of the circuits contained within the programmable delay switch are inventions in their own right which may be used in a variety of applications. The backgrounds and summaries of four of these circuits are set forth below.

1. Undervoltage Lockout Circuit with Sleep Pin

BACKGROUND

An undervoltage lockout circuit is a circuit which keeps the rest of the circuitry of an integrated circuit disabled until the power supply reaches a specified level. Ideally, an undervoltage lockout circuit would keep the integrated circuit supply current at zero until the specified voltage is reached. A conventional undervoltage lockout circuit is shown in FIG. 3. The circuit uses a simple resistor divider for providing a measure of the supply voltage to a comparator 104 which compares that level to a band gap reference 102. The enable threshold is reached when Vcc=VBG (R17+R18+R19)/R19. Upon enabling the integrated circuit, a current supply transistor 106 is turned on. With the integrated circuit enabled, a transistor 100, having a base connected to the base of the current supply transistor 106, provides a short around resistor R17. Therefore, the disable threshold is reached when Vcc=VBG (R18+R19)/R19. The disable threshold is lower than the enable threshold thereby providing hysteresis which avoids jitter around the threshold. The band gap reference 102 is connected to the voltage supply and draws current even when the supply voltage is at a low level. It would be preferable, however, to keep the current drain on the supply terminal very low until the undervoltage lockout enable threshold has been reached.

Another distinct method for reducing the current drain of an integrated circuit is the provision of a sleep pin. When a circuit is in sleep mode, the integrated circuit draws at most a very small microcurrent. It is further desirable in an integrated circuit to reduce pin count so that the circuit may be sold in a smaller and less expensive package. Therefore, the ability to provide additional functions on any of the limited number of pins in a particular package is advantageous.

SUMMARY

In accordance with one embodiment, a pin is provided on an integrated circuit which functions both as the ramp pin and the sleep pin. The ramp pin is intended for connection to an external capacitor. Within the circuit, a comparator receives a voltage from the ramp pin for making a comparison with a control voltage. A current source within the circuit is used for charging the external capacitor through the ramp pin. The circuit further includes a sleep switch connected to the ramp pin which is activated when the ramp pin falls below a predetermined voltage threshold for entering the sleep mode. Under normal operation, the external capacitor is being charged and discharged within a voltage range above the predetermined voltage threshold. When the ramp pin falls below the predetermined voltage threshold, the switch disables the current source to the ramp pin and, moreover, disables the entire integrated circuit.

The sleep switch may be a transistor which is normally reverse biased while the external capacitor is charging and discharging. A discharge clamp may be provided in connection with the ramp pin to prevent the external capacitor from discharging below a minimum reference voltage in normal operation.

In accordance with another embodiment, a sleep pin is provided for use in conjunction with an undervoltage lockout circuit. The undervoltage lockout circuit enables the integrated circuit when the supply voltage rises above an enable threshold and disables the integrated circuit when the supply voltage falls below a disable threshold. Hysteresis may be provided in the undervoltage lockout circuit by making the disable threshold lower than the enable threshold. A transistor is provided with its collector connected to the undervoltage lockout circuit, an emitter coupled through a semiconductor junction to ground, and its base coupled to the voltage supply. A second semiconductor junction is connected between the base of the transistor and a sleep pin such that when the sleep pin is forced below a predetermined threshold, current is prevented from flowing through the collector of the transistor so as to disable the undervoltage lockout circuit thereby disabling the entire integrated circuit. The integrated circuit remains off until the undervoltage lockout circuit is enabled and the voltage supply exceeds the enable threshold.

The undervoltage lockout circuit of a present embodiment includes a detection leg connected to the supply terminal. The integrated circuit also includes a current supply, connected to the supply terminal, for permitting current flow to the rest of the integrated circuit. A differential comparator is responsive to a detection voltage across a resistive portion of the detection leg for enabling the current supply when the detection voltage rises past a first threshold. The differential comparator may be provided with hysteresis so that it disables the current supply when the detection voltage falls below a second threshold lower than the first threshold. In accordance with a present embodiment, the difference between the first and second thresholds is a function of the relative emitter areas of the transistors forming the comparator. Hysteresis is achieved in the differential comparator by providing a Schmitt trigger circuit for steering current to three transistors with common emitters. The Schmitt trigger provides a first current path for one of the three transistors and a second current path for the second of the three transistors. The third transistor receives current through one of the two current paths when the integrated circuit is enabled and through the other current path when the integrated circuit is disabled. As the current to the third transistor is shifted from one path to the other, a diode in the detection leg is switched in or out of the detection leg. This diode also contributes to the difference between the enable and disable thresholds. The contribution from the diode has a negative temperature coefficient whereas the contribution from the comparator and Schmitt trigger has a positive temperature coefficient. Therefore, the enable and disable thresholds are substantially temperature independent.

The detection leg may be provided with a series of diodes. Until the voltage level of the combined semiconductor junction voltages of the diodes has been reached, no current flows within the integrated circuit other than a small microcurrent in the detection leg. As the voltage exceeds the combined semiconductor junction voltages of the diodes in the detection leg, a small current flows through the undervoltage lockout circuit. The differential comparator is connected across a resistive portion of the detection leg to obtain a measure corresponding to the voltage on the voltage supply terminal. When the supply voltage rises above the enable threshold, the current supply is enabled which permits supply current to flow throughout the integrated circuit.

The sleep pin advantageously takes advantage of the undervoltage lockout circuit. The undervoltage lockout circuit is disabled when the sleep pin is brought below a predetermined voltage threshold. In order to conserve pin count, the sleep pin may advantageously be used as a ramp pin or for some other function. As a ramp pin, it is connected to a comparator for comparing the voltage on the ramp pin to a control voltage. Under normal operation, the external capacitor connected to the ramp pin is prevented from discharging below a minimum voltage so that the predetermined voltage threshold for sleep mode is only reached when the pin is forced below the normal range of operation.

The undervoltage lockout circuit of the embodiments described herein advantageously keeps the supply current very low until the undervoltage lockout enable threshold has been reached. The undervoltage lockout threshold determination is accomplished without the use of a band gap reference. Thus, the current normally required for a band gap reference is not needed. Instead of a band gap reference, the enable and disable thresholds are determined as a function of the ratio of emitter areas on the transistors forming the comparator. A third transistor is provided in the comparator so that two thresholds may be provided by the circuit, one for the supply voltage while it is rising and another lower threshold for shutting off the circuit when the supply voltage is falling from an enabled condition. Temperature compensation to provide a substantially temperature independent threshold for the supply voltage is provided by diodes in the detection leg, one of which is switched in and out of the circuit as the current to the third transistor is steered between two supply paths.

2. Comparator with Latch

BACKGROUND

In a pulse width modulator, an error control signal is compared with a ramp or oscillator voltage. A block diagram of a conventional prior art circuit is shown in FIG. 7. When the ramp or oscillator signal crosses above the error control signal, the comparator senses this crossing and latches this information into a flip-flop which then turns on an output device. Typically, the output of the flip-flop is used to turn on the output device. A reset command is then required to turn the output off. The flip-flop is an additional stage which adds a delay in the signal path to the output. High speed applications may find this delay unacceptable.

SUMMARY

In the present embodiment, a latch operates in parallel with a comparator so as to meet high speed requirements for a latchable comparator. The latch itself includes a latching comparator having an input which receives a comparison signal generated by a comparator comparing the ramp voltage and the error control signal. The output from the latching comparator and a reset input are provided to a circuit which functionally resembles a flip-flop. This circuit generates a latch signal to a second input of the latching comparator when the reset signal is in the non-reset state and the output from the latching comparator has been tripped into the first set state by the comparison signal. The latch signal has a voltage outside the range of voltages exhibited by the comparison signal. Thus, with the latch signal on the second input of the latching comparator the output of the latching comparator remains in the first set state regardless of the value on the first input. If the reset signal is applied to the flip-flop like circuit or if the output from the latching comparator is in the second non-set state, a comparator reference signal having a voltage between the low and high values received at the first input of the latching comparator is generated by the flip-flop like circuit. In this condition, the circuit operates as a simple comparator. The output of the latchable comparator may be taken from the latching comparator. The flip-flop like circuit thus operates in parallel with the latching comparator so that the flip-flop like circuit does not add the propagation delay of an additional stage.

According to an embodiment of the comparator with latch, a first comparator includes a ramp input and a control input. The comparator generates a high value signal or low value signal depending upon a comparison between the ramp input and the control input. A second comparator has a first input receiving the output from the first comparator. The second comparator generates a first or second state at its output depending upon a comparison between its input from the first comparator and a second input. A latching circuit for providing a latch signal to the second input of the comparator has an input coupled to the output of the second comparator and a reset input. When the reset signal is in the non-reset state and the output from the second comparator is in the first state, a latch signal is provided to the second comparator. The latch signal is outside the range of voltages extending between the low value signal and the high value signal. Thus, the second comparator remains in the first state when the latch signal is being provided.

This embodiment may further include a second output on the first comparator which provides a low valued signal when the first output is a high valued signal and provides a high valued signal when the first output provides a low valued signal. A third comparator is connected to this second output from the first comparator. A second input to the third comparator is connected to receive a second latch signal from the latching circuit. The latch signal to the second comparator is below the low valued signal and the latch signal to the third comparator is above the high valued signal. A fourth comparator may be provided for receiving the outputs from each of the second and third comparators. The fourth comparator is latched high when the latching circuit is generating the first and second latch signals.

The circuit may also be viewed as a four input comparator with two outputs. One of the outputs is used by a flip-flop like circuit for generating the latch signals to two of the inputs to the comparator. The flip-flop is thus connected in parallel with the comparator and thus does not slow down its operation.

3. Op-amp Clamp for Capacitor Discharge

BACKGROUND

There are many ways to clamp a capacitor voltage and stop the capacitor from discharging once its voltage has reached a known value. Referring to FIG. 12A, zener clamping is shown. A zener diode Z0 is connected between the capacitor and Vreg. The capacitor discharges through transistor N45 until the zener breaks down. The transistor N45 then absorbs the zener current and the capacitor is clamped at Vreg-Vz. In FIG. 12B, an example of NPN clamping is shown. The predetermined minimum discharging voltage is Vclamp. Vclamp is applied to the base of a PNP transistor P11. The emitter of the PNP transistor P11 is connected to the base of an NPN transistor N47. The base of the NPN transistor N47 is 1 Vbe above the voltage on the capacitor. Because of the PNP the base of the NPN transistor N47 is also 1 Vbe above Vclamp when the NPN transistor N47 is off during discharging. Therefore the capacitor can only discharge down to Vclamp. An example of PNP clamping is shown in FIG. 12C. A PNP transistor P12 is connected between the capacitor and ground. When the capacitor is charging, the PNP transistor P12 is held off. During discharging, the PNP transistor is on. The base of the PNP transistor cannot fall lower than 1 Vbe below Vclamp. The capacitor C which is 1 Vbe above the base of the PNP transistor P12 thus cannot fall below Vclamp.

Another method is to use an op-amp 162 for clamping the discharge voltage of a capacitor. A conventional op-amp clamp is shown in FIG. 12D. The output of the op-amp 162 is connected to the capacitor C. The output of the op-amp 162 is also fed back to the inverting input of the op-amp. The capacitor is thus clamped to the positive input of the op-amp 162. By providing a desired charging level or a desired discharging level to the positive input of the op-amp, the capacitor C is controlled to charge to the charging level or discharge to the discharging level.

SUMMARY

In accordance with a present embodiment, an input to a differential amplifier is held to a reference clamp voltage. This is the minimum discharge level for the capacitor connected to a ramp pin. A discharging transistor is coupled between the ramp pin and ground. The output of the differential amplifier is coupled to the discharging transistor for preventing the voltage on the ramp pin from being pulled below a reference voltage determined by the reference clamp voltage. The discharging transistor is thus used to discharge the capacitor and also to close the feedback loop of the differential amplifier. Rather than switching the input of the amplifier as in the prior art clamp of FIG. 12D, a discharging signal is received at the base of the discharging transistor to switch the discharging transistor off or on. The capacitor attached to the ramp pin provides both the ramp signal and serves to stabilize the loop response of the differential amplifier.

In accordance with a present embodiment, the differential amplifier is a transconductance amplifier. The transconductance amplifier provides a current output. The current output is connected to a semiconductor junction which is arranged as a current mirror with the discharging transistor.

The discharge clamp described herein advantageously provides high speed clamping, low current drain, quick response from a charge signal to the actual charging of the capacitor and an accurate discharge clamp voltage.

4. Totem Pole Driver

BACKGROUND

A totem pole output is formed by two transistors, a top transistor and a bottom transistor. When the output is supposed to be pulled high, the top transistor is turned on and the bottom transistor is off. When the output is pulled low, the top transistor is off and the bottom transistor is turned on. The problem with driving an output with a totem pole driver is that the off transistor turns on faster than the on transistor turns off. This creates a low impedance path between the high supply and ground at the moment of switching the output transistors. If no precautions are taken, the instantaneous power across the output transistors can get very large causing the output stage to lose efficiency. This is commonly referred to as a "lossy" output stage.

One approach to totem pole switch design is to provide propagation delay when switching one of the transistors so that one of the transistors is turned off before the other is turned on. However, this solution only works in one direction. For example, such a circuit may be able to turn the bottom transistor off before the top transistor turns on. However, in the opposite direction, the bottom transistor turns on before the top transistor has a chance to shut off. The requirement that this cross conduction be eliminated is even more stringent for applications where the driver is operating at a high voltage such as 50 volts rather than the typical logic circuit which operates at about 5 volts.

SUMMARY

In a totem pole driver, top and bottom output transistors are arranged in a totem pole to provide the output of the circuit. A first circuit path is provided to the bottom output transistor for switching it on and off in response to a switching signal. A second circuit path, slower than the first path, is directed to the top output transistor for turning that transistor on in response to the switching signal but after the bottom output transistor has been switched off. Advantageously, a third circuit path is provided to the top output transistor for turning the top output transistor off in response to a sync signal. The sync signal has a known timing which leads the switching signal. Thus, the top output transistor gets turned off before the bottom output transistor turns on through the first circuit path.

In accordance with a further embodiment, an emergency voltage supply is arranged to hold the bottom output transistor on and the top output transistor off in the event of a loss of regulated circuit voltage Vreg. In an embodiment in which the totem pole driver is used to drive a FET, the emergency voltage supply may be the drain of the FET. In this manner, any harmful voltage that may be applied across the FET is itself used as the emergency voltage supply to protect the FET. A first transistor is coupled between the regulated circuit voltage Vreg and the base of the bottom output transistor so as to be able to provide current to the base of the bottom output transistor when Vreg is applied to the base of the first transistor. A switch is connected in between the regulated circuit voltage Vreg and the first transistor. A supplier of base drive current is connected to the base of the top output transistor. A second transistor is arranged with a base coupled to the regulated circuit voltage, a collector coupled to the supplier of base drive current and an emitter connected to ground. The emergency voltage supply is also coupled to the bases of the first transistor and the second transistor. This circuit arrangement provides that the first transistor and second transistor are held on by the emergency voltage supply if the regulated circuit voltage is lost. Thus, with the first transistor on, current is supplied to the bottom output transistor to hold it on. With the second transistor on, the supply of base drive current to the top output transistor is shunted to ground to thereby hold the top output transistor off protecting any device connected to the totem pole output.

Other objects and advantages of the invention will become apparent during the following descriptions of the presently preferred embodiments of the invention taken in conjunction with the drawings.

DETAILED DESCRIPTION OF THE PREFERRED EMBODIMENTS

Secondary Side Post Regulator

Figure 1:
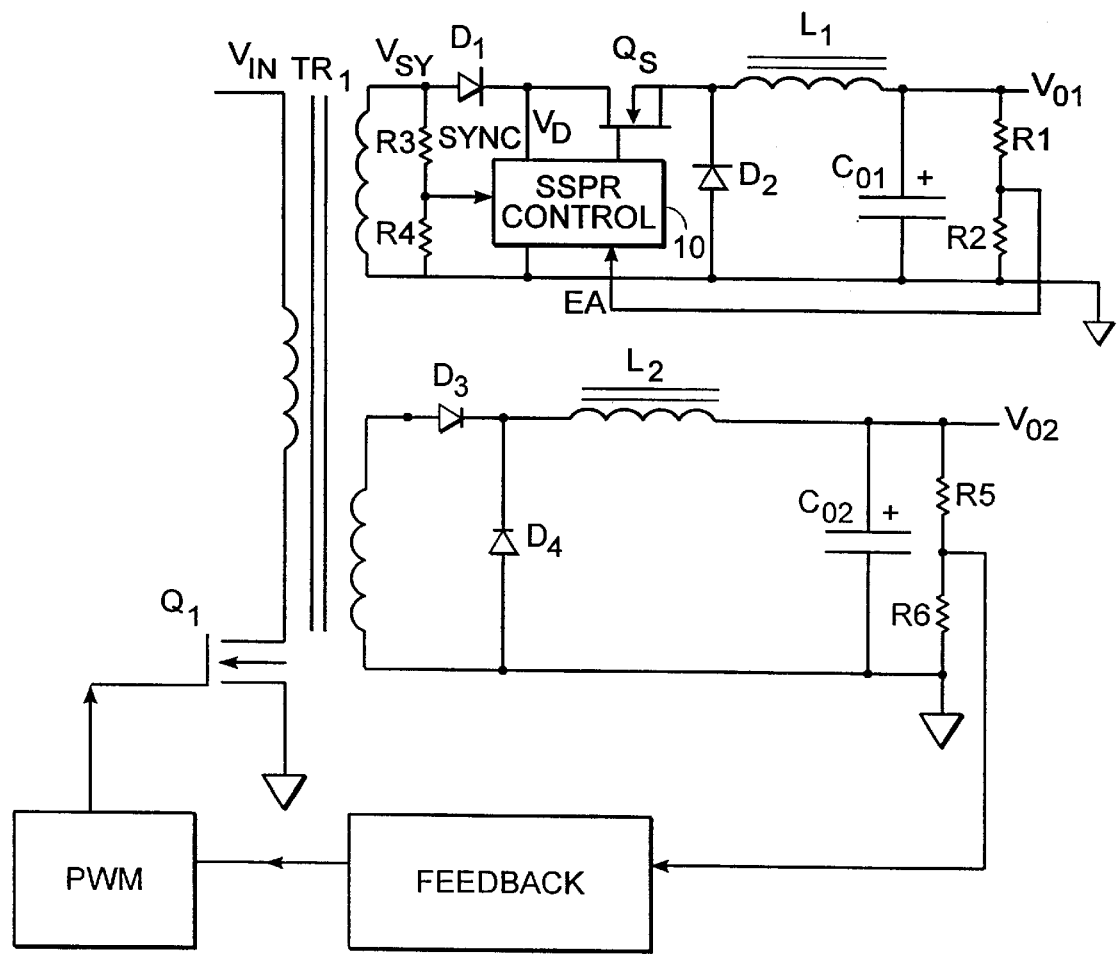
FIG. 1 is a schematic block diagram of a secondary side post regulator of the present invention.

Referring now to the drawings, a secondary side post regulator taking advantage of the switch with programmable delay of the invention is shown in FIG. 1. The switch 10 with programmable delay may be fabricated on an integrated circuit. The switch 10, for use as the secondary side post regulator control, includes an output driver preferably a grounded totem pole driver. The driver is used to control the switching device, illustrated in FIG. 1 as an FET QS. The switch 10 is connected to the gate of the FET for providing the output from the totem pole driver. The driver will either provide a low impedance path between a first terminal and a second terminal or will drive an output signal into the first terminal. The first terminal is preferably connected to the gate of the FET and the second terminal is preferably ground. The switch 10 receives a sense signal from the output voltage of the FET. The source of the FET QS provides the output voltage. The output voltage is shown connected to an inductor L1 which filters high frequency from the output voltage. A voltage divider formed by resistors R1 and R2 provide a divided down sense signal of the output voltage. The output voltage is essentially a DC voltage. The switch 10 also receives an input signal corresponding to the voltage on the secondary winding. Resistors R3 and R4 provide a voltage divider which divide down the voltage $V_{sy}$ on the secondary winding to provide a sync signal to the switch 10.

The switch 10 includes a programmable delay circuit for receiving the voltage sense signal from the output voltage. A first state signal is generated by the programmable delay circuit upon completion of a delay following a first, or rising, edge of the sync signal. The delay is determined by the voltage sense signal. A second state signal is generated by the programmable delay circuit a short time after the second, or falling, edge of the sync signal. The first edge and the second edge are opposite one another in that one is a rising edge and the other is a falling edge. In the preferred embodiment, the falling edge of the sync signal is used to trigger the discharging of a timing capacitor. As such, the second state signal is generated when both the sync signal has fallen and the voltage on the timing capacitor has fallen below a predetermined discharge level. The grounded totem pole driver responds to the first and second state signals. The first state signal causes an output to be driven into the gate of the FET. The second state signal causes a low impedance path to connect the gate of the FET to ground. The low impedance path is maintained even when the rising edge of the sync signal is applied to the drain of the FET until the delay period has been completed.

A connection is shown in FIG. 1 between the drain of the FET and the switch 10 of the invention. As will be described below, the drain of the FET can be used as an emergency voltage supply in the switch 10 to maintain the output driver in the low impedance state when the integrated circuit supply voltage is lost or during sleep mode. FIG. 1 further illustrates a conventional primary control loop for controlling the current through the primary winding. Any number of secondary side post regulators may be provided on the secondary side of a transformer.

Switch With Programmable Delay

Figure 2:
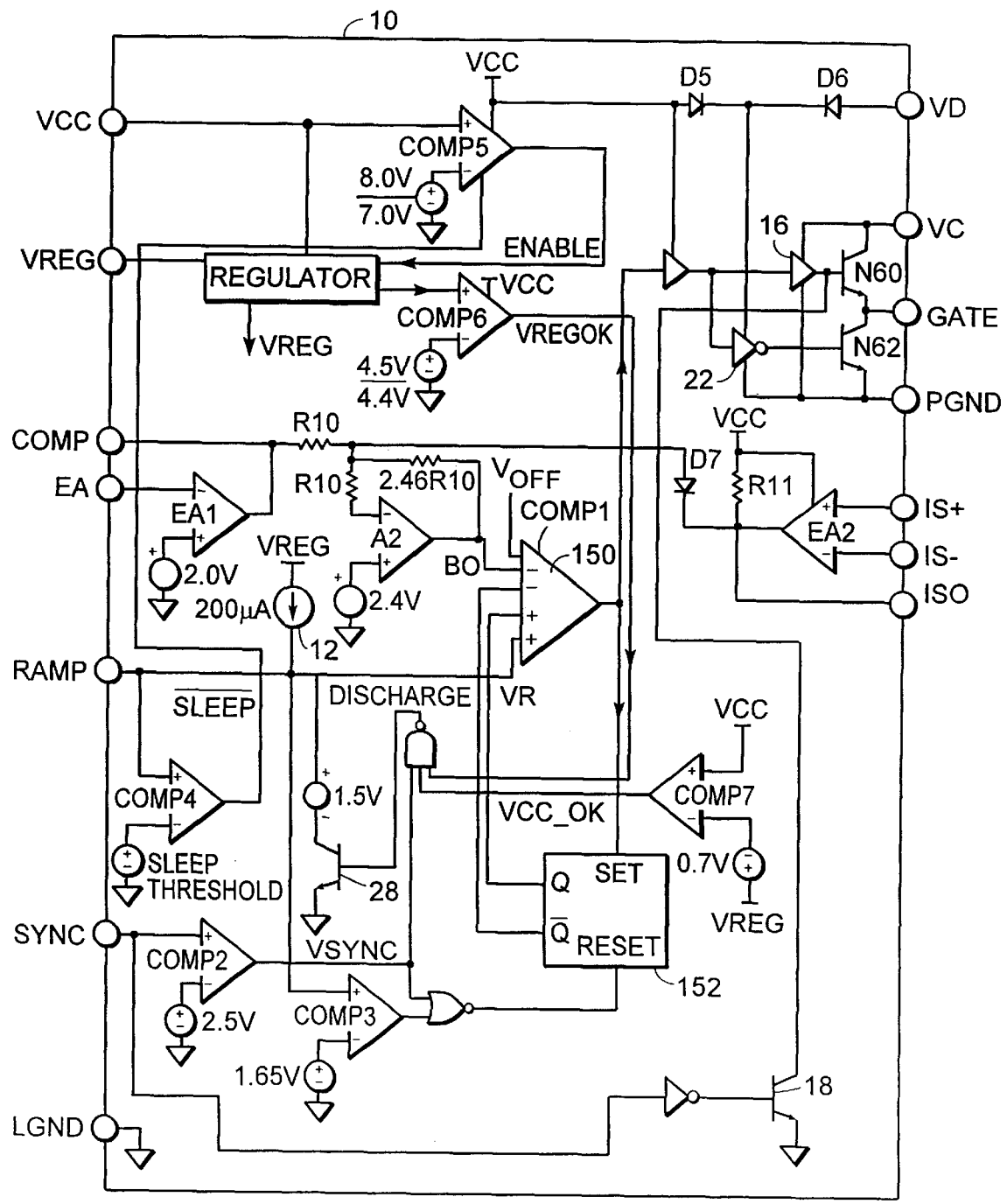
FIG. 2 is a schematic block diagram of a programmable delay switch integrated circuit of the present invention.

Referring now to FIG. 2, the switch with programmable delay shall be described in greater detail. An error amplifier EA1 receives a voltage sense signal at the EA terminal. The error amplifier produces an output on a compensation terminal COMP. The output is also used by a buffer A2 to produce an error control signal. The buffer A2 is designed as an inverter for inverting the polarity of the output from the error amplifier EA1. The buffer has a gain of −1.23 in the presently preferred embodiment. The buffer A2 also acts as a linear summer to combine the output from error amplifier EA1 with the output received from a current sense amplifier EA2.

The current sense amplifier EA2 is provided for connection to a current sense signal to provide a measure of the output current through the device being switched. For example, as in the application of FIG. 1, the output current of the FET could be sensed and provided to the current sense amplifier. Under normal conditions, the output of the current sense amplifier EA2 is high and is prevented by diode D7 from affecting the error control signal. However, in the event of an overcurrent condition, the current sense amplifier goes low and pulls the error control signal current. The current sense amplifier EA2 is designed so that it can sink more current than the error amplifier EA1 is able to provide. Therefore, under an overcurrent condition, a low signal is provided to the negative input of the buffer A2. The buffer A2 responds by providing a high signal to a comparator 150. This high signal is above the upper limit of the ramp signal so that the comparator 150 can no longer generate a command to the output driver to switch on the output signal.

Under normal conditions, the error control signal as processed through the buffer A2 is applied to the comparator 150. The comparator 150 uses the error control signal to determine the delay period following the rising edge of the sync signal before switching on the output driver. The error control signal is received at an inverting input of the comparator 150 and a ramp signal from an external timing capacitor is received at the positive input of the comparator. Upon occurrence of the rising edge of the sync signal, the timing capacitor externally connected to the ramp terminal is charged by a current source 12. The current source of 200 microamps is shown in FIG. 2. The delay period is determined by the time it takes the external timing capacitor to charge up to the voltage level of the error control signal. When the ramp signal crosses above the error control signal, the comparator 150 generates an output signal to turn on the output driver. A flip-flop like circuit 152 is connected in parallel with the comparator 150. The output of the comparator 150 is connected to the set input of the flip-flop like circuit 152. Upon generation of the output signal that switches on the output driver, the flip-flop like circuit 152 latches the comparator 150 so that the output continues to be driven. The latch on the comparator 150 is not released until the flip-flop like circuit 152 receives a reset signal.

The reset signal, in accordance with an embodiment of the invention, is generated only when the voltage on the timing capacitor falls below a predetermined threshold and the sync signal falls below a predetermined threshold. A comparator COMP2 detects the low state of the sync signal and the comparator COMP3 detects the low condition of the ramp signal. Only when both of these signals are low will the reset signal be generated. Normally, the sync signal falls low first. The comparator COMP2 goes low when the sync signal falls below 2.5 volts. It is upon the falling edge of the sync signal that discharging of the ramp occurs. FIG. 2 provides a rough schematic of discharging the ramp. The falling edge of the sync signal causes a discharge signal to a discharging transistor 28. The discharging transistor 28 pulls greater than 200 microamps of current so as to discharge the external ramp capacitor. A discharge clamp of 1.5 volts is provided in the discharging circuit to prevent the ramp signal from being pulled below 1.5 volts by the discharging transistor. The comparator COMP3 is triggered when the ramp signal falls below 1.65 volts. Thus, there is a short delay after the falling edge of the sync signal before the reset signal is triggered to release the comparator 150.

The comparator 150 also has an additional input in parallel with the error control voltage. This input is the Voff signal which is derived from the sync signal. The Voff signal is the inverse of the sync signal. When the sync signal goes high, Voff goes low to below the 1.5 volt discharge minimum for the ramp. When the sync signal goes low, Voff goes above the discharge level of the ramp. The comparator 150 compares the ramp signal to whichever is higher, the error control voltage or Voff. When the sync signal is low, the ramp is discharged. Under these conditions, the comparator 150 should be generating a signal to the output driver that puts it in its low impedance state. If the circuit is in startup or if the output voltage of the device being switched is low, the error control signal may be below the ramp discharge level. Thus, Voff will hold the comparator 150 in the proper state. When the sync signal goes high, the Voff signal goes below the ramp discharge level so that the comparator is switched without delaying for the ramp to charge under these startup type conditions.

The output driver of an embodiment of the invention is a grounded totem pole driver including the top output transistor N60 and a bottom output transistor N62. It is desirable to avoid cross conduction between the two output transistors. In other words, the top output transistor should be turned off before the bottom output transistor is turned on. Likewise, the bottom output transistor should be turned off before the top output transistor is turned on. Turning on the bottom output transistor N62 provides the low impedance path between the gate terminal and the power ground terminal. Turning on the top output transistor N60 drives an output signal from the power supply VC into the gate terminal. Due to the cross conduction prevention of an embodiment of the present invention, the power supplied to terminal VC may be from within a broad operating range of from 8V to 75V. In order to achieve cross conduction prevention, a propagation delay indicated by buffer 16 is in a path to the top output transistor N60. When a signal from the comparator 150 is provided to turn on the top output transistor, the signal is given the opposite effect along another path to the bottom output transistor N62. The path to the bottom output transistor N62 is shown going through an inverter 22. The signal turning off bottom output transistor N62 reaches the bottom output transistor before the complementary signal turning on the top output transistor N60 gets to its destination. In order to turn the top output transistor off before the bottom output transistor N62 is turned on, a third path is provided making use of the sync signal. The falling edge of the sync signal causes a transistor 18 to immediately pull the top output transistor off. A short time later when the ramp signal has been discharged below 1.65 volts, a flip-flop like circuit 152 issues the reset signal which then allows the comparator 150 to send out a signal turning on the bottom output transistor N62 to provide a low impedance path from the gate terminal to the power ground terminal.

The switch with programmable delay integrated circuit 10 is also provided with an undervoltage lockout circuit illustrated by comparator COMP5. The undervoltage lockout circuit advantageously is provided with hysteresis so that the enable threshold is higher than the disable threshold. When the integrated circuit is not enabled, a microcurrent flows for detection by the undervoltage lockout circuit. Once the supply voltage at the Vcc terminal crosses above the enable threshold of the undervoltage lockout circuit, current is provided to the integrated circuit and the 5 volt regulator providing a Vref voltage for the circuit is enabled. In FIG. 2, an enable threshold of 8 volts is shown and a disable threshold of 7 volts is indicated. Once the integrated circuit has been enabled, the threshold changes from the enable threshold to the disable threshold. Not until the supply voltage falls below the disable threshold will the circuit be disabled and the 5 volt regulator switched off.

In accordance with an embodiment of the invention, a sleep mode can be implemented in conjunction with the undervoltage lockout circuit. The sleep mode may be implemented by providing a signal which disables the undervoltage lockout circuit thereby disabling the integrated circuit. Further in accordance with an embodiment of the invention, the sleep mode may be implemented on the same terminal that provides the ramp function. Under normal operation, the ramp signal cannot be pulled below 1.5 volts. When an external signal is applied to the ramp terminal which brings the terminal below a sleep threshold substantially lower than the 1.5 volts, that signal may be used to disable the undervoltage lockout circuit.

The switch with programmable delay integrated circuit may be provided with additional fault protection. A comparator COMP6 may be provided to detect whether the 5 volt regulator is operating properly. If the 5 volt regulator falls below a predetermined threshold, 4.4 volts for example, a fault signal is issued which is directed to the ramp input of the comparator 150. The fault signal discharges the ramp capacitor thereby preventing the comparator 150 from generating a signal to turn on the top output transistor N60. The Vreg comparator COMP6 may be provided with hysteresis to avoid jitter in this fault signal. For example, the fault signal may be issued when Vreg falls below 4.4 volts, whereas the fault signal will be changed to a Vreg OK signal once the voltage on the reference rises back above 4.5 volts.

Additional fault protection may be provided by detecting whether the supply voltage is at an acceptable level. A comparator COMP7 may be provided to detect whether the supply voltage Vcc has fallen below Vreg. It is possible that a capacitor on the Vref terminal is holding the regulated voltage up for a time following the loss of the supply voltage. If the supply voltage falls below the Vreg, a signal is sent just like the Vreg OK signal to discharge the timing capacitor and disable the comparator 150. An offset voltage may be included so that the comparator COMP7 is triggered it the supply voltage falls to more than the offset voltage below Vreg. The offset voltage allows for an application in which Vcc and Vreg are both tied to an externally regulated voltage. In the presently preferred embodiment, an offset of 0.7V is used.

If the circuit is in sleep mode or undervoltage lockout, it would be undesirable to permit uncontrolled output signal to be conducted through the gate terminal. It is far preferable to have the output driver under such fault conditions default into a low impedance state. In accordance with an embodiment of the invention, an emergency voltage supply is provided which will hold the bottom transistor N62 on and the top transistor N60 off under such fault conditions. In accordance with a preferred embodiment, the voltage on the drain terminal is used as the emergency voltage supply. In the particular example where the switch with programmable delay 10 is being used to drive a FET, the dangerous condition exists when there is a high voltage on the drain of the FET. By using the drain voltage itself to provide the power to hold the bottom output transistor on and the top output transistor N60 off, the dangerous condition is averted.

In laying out the integrated circuit for the switch with programmable delay 10, it is preferred that a large epitaxial moat be provided to separate the interface circuitry at the drain terminal $V_D$ and SYNC terminal from the logic switching circuitry. The moat advantageously protects the switch 10 from parasitic below ground signals on either of these two terminals.

Various circuits implementing the inventive features of the switch with programmable delay 10 of the present invention are described below in greater detail in conjunction with the accompanying drawings.

Undervoltage Lockout Circuit

Figure 4:
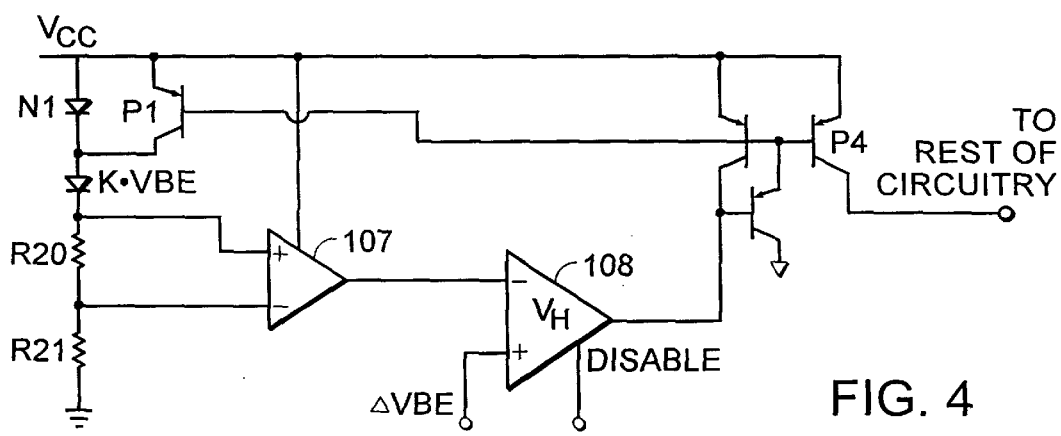
FIG. 4 is a schematic block diagram of a presently preferred embodiment of an under voltage lockout circuit for use in the programmable delay switch integrated circuit of FIG. 2.

Referring now to FIG. 4, a schematic block diagram of an embodiment of an undervoltage lockout circuit is illustrated. A supply terminal Vcc receives the supply voltage. A detection leg including a detection resistance R20 is connected between the supply Vcc and ground. The detection leg may include a series of diodes. Additional resistance R21 may be provided in the detection leg to limit the amount of detection current through the detection leg. The diagram shows K+1 diodes where K is an integer. The diodes set a threshold of K+1 times the semiconductor junction voltages of each of the diodes. Until the threshold set by the diodes has been reached, substantially no current flows through the detection leg or any of the integrated circuit. The only current is a microcurrent in the detection leg of less than a few microamps.

A differential comparator is represented in FIG. 4 by a buffer 107 and a comparator 108. The buffer 107 is connected with inputs at either end of a resistive portion of the detection leg. In the embodiment shown, the positive input of the buffer 107 is connected to one end of resistor R20 and the negative input of the buffer 107 is connected to the other end of resistor R20. The voltage across R20 is then compared with a $\Delta$ Vbe created by the different emitter areas of the transistors in the differential comparator. When the voltage across resistor R20 rises above the $\Delta$ Vbe, the undervoltage lockout circuit enables a current source which permits current to flow throughout the integrated circuit. A current supply transistor P4 is turned on when the enable threshold has been crossed.

The comparator 108 is a hysteretic comparator. Thus, when the current supply is turned on, the voltage reference $\Delta$Vbe is reduced by an amount Vh. This forms a second lower threshold which is used by the undervoltage lockout circuit to disable the integrated circuit should the supply voltage drop below the second threshold.

Enabling of the integrated circuit also switches on a transistor P1 which provides a short around one or more of the diodes. In the presently preferred embodiment, this eliminates one of the diodes from the detection leg and changes the temperature response so that the enable and disable thresholds at the supply terminal are relatively temperature independent. Adding up the voltages in the detection leg, the enable threshold and the lower disable threshold can be represented mathematically. At the enable threshold, $Vcc_{enable}=((R20+R21)/R20)\times\Delta Vbe+(K+1)\times Vbe$. At the disable threshold, $Vcc_{disable}=((R20+R21)/R20)\times(\Delta Vbe-Vh)+K\times Vbe)$. Vbe is the semiconductor junction voltage for each of the diodes. Vbe has a negative temperature coefficient. Vh has a positive temperature coefficient. In accordance with an embodiment of FIG. 5, the resistor values in the detection leg and resistor R25 are selected so that the enable threshold and the disable threshold are each substantially temperature independent.

Figure 5:
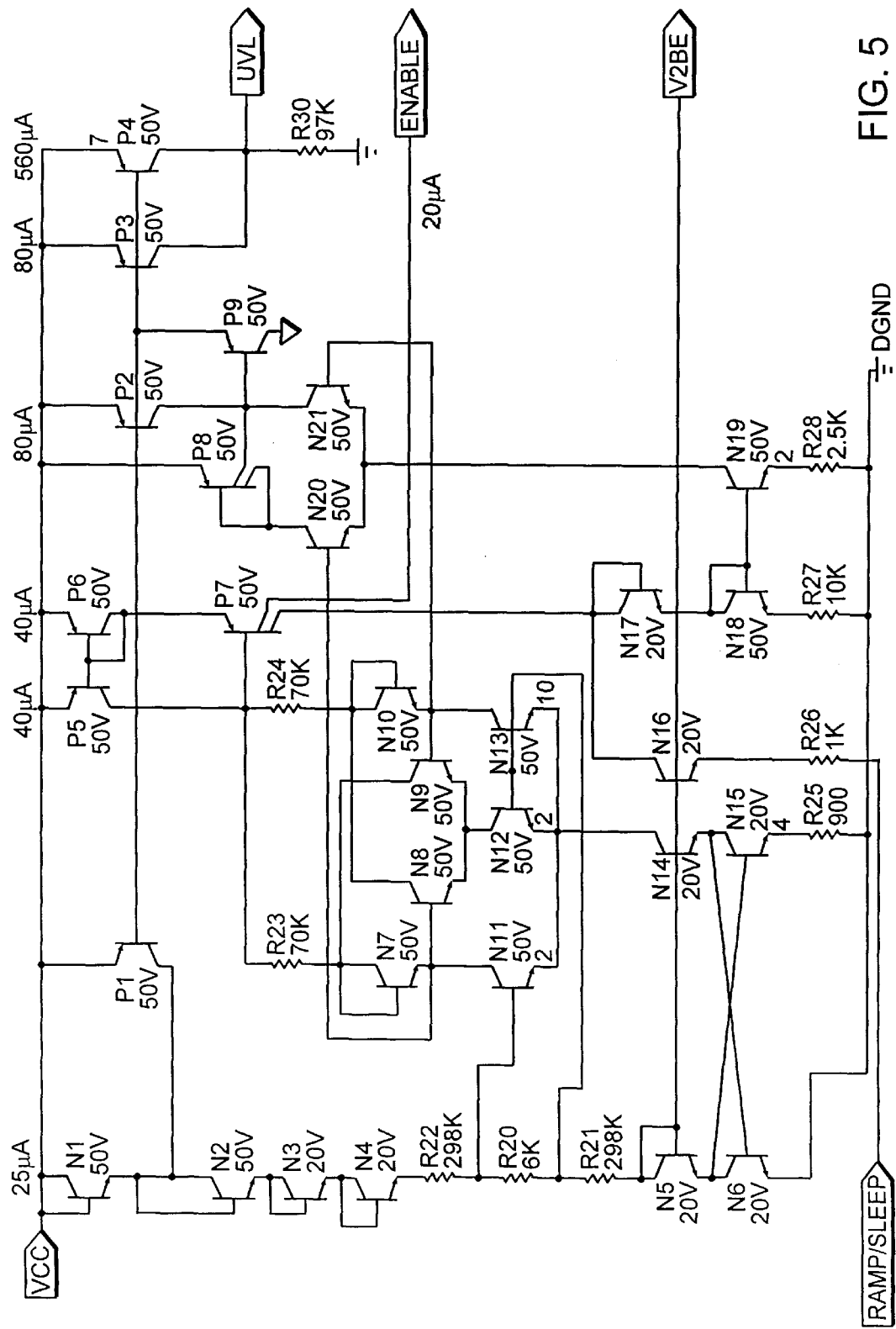
FIG. 5 is a circuit diagram of the undervoltage lockout circuit of FIG. 4 and of a dual function sleep/ramp pin for use in the programmable delay switch integrated circuit of FIG. 2.

Referring now to FIG. 5, the presently preferred embodiment of the undervoltage lockout circuit will be described. A detection leg is connected between the supply terminal Vcc and ground. The detection leg is the only portion of the integrated circuit that conducts current while the undervoltage lockout circuit and the integrated circuit are disabled. The current through the detection leg is a microcurrent which rises to at most to about 25 $\mu$a for a 15V supply voltage in the presently preferred embodiment. A series of large resistors R22 and R21 limit the size of the current through the detection leg.

The detection leg includes a series of transistors arranged to provide a number of semiconductor junctions in phase along the detection leg. The semiconductor junctions in the detection leg include the base-emitter circuits of transistors N1, N2, N3, N4, N14 and N6. Also cross connected with transistors N14 and N6 include transistor N5 configured as a diode and a base emitter junction of N15. The diode configured transistor N1 is connected in parallel with a PNP transistor P1. Transistor P1 has a common base with the current supply to the integrated circuit formed by transistors P3 and P4. When the undervoltage lockout circuit turns on the integrated circuit, the current supply P3, P4 is on and likewise transistor P1 turns on shorting around the diode N1. This causes a jump on the voltage across the detection resistance R20, helping to ensure that there is no output jitter upon crossing the enable voltage threshold. In the embodiment of FIG. 5, there are 6 semiconductor junctions in the detection leg. Therefore, as the voltage at the supply terminal rises above the combined semiconductor junction voltages of these 6 junctions, current may begin to flow in the undervoltage lockout circuit. Current for the undervoltage lockout circuit is sourced by the current sink formed by transistors N5, N6, N14, N15 and resistor R25. When detection leg voltage exceeds its combined semiconductor junction voltages, this current source enables approximately 150 $\mu$a of current to flow in the undervoltage lockout circuit of the presently preferred embodiment.

A hysteretic differential comparator is responsive to a detection voltage across resistor R20. The hysteretic differential comparator is formed by two current steering comparators and a Schmitt trigger. At the input end of the hysteretic differential comparator a current steering comparator is formed by a first transistor N11, a second transistor N13 and a third transistor N12. The base of the first transistor N11 is the positive input to the comparator. The second transistor N13 and the third transistor N12 have a common base which acts as the negative input to the comparator. The emitters of the first, second and third transistors are all connected. In accordance with the presently preferred embodiment, the emitter area of the first transistor N11 is two times standard, the emitter area of the second transistor N13 is ten times standard and the emitter area of the third transistor N12 is two times standard. The current source, formed by transistors N14, N15, N5, N6 and the resistor R25, sinks bias current from the input current steering comparator.

The Schmitt trigger is formed by transistors N7, N8, N9, N10 and resistors R23 and R24. Current through the Schmitt trigger is split between a first current path through resistor R23 and a second current path through resistor R24. The first transistor N11 receives its collector current from the first current path through resistor R23. The second transistor N13 receives its collector current from the second current path through resistor R24. The current into the collector of third transistor N12 will come from either the first current path or the second current path. When the chip is in a disabled state due to an undervoltage condition on the supply terminal, the Schmitt trigger provides current to the third transistor N12 through the second current path including resistor R24. When the undervoltage lockout circuit is in the enabled condition, current is provided to the third transistor N12 through the first current path including resistor R23. This difference in the current through the first and second current paths provides the hysteresis voltage Vh which results in different thresholds on the way up and on the way down for the hysteretic differential comparator.

A current steering comparator including transistors N20 and N21 is at the output of the hysteretic differential comparator. The base of transistor N20 is connected to the base of transistor N8. The base of transistor N21 is connected to the base of transistor N9. Current through the current steering transistors N20 and N21 is pulled by current source transistor N19 and into resistor R28 to ground. Transistor P5 and transistor P6 mirror the current established by transistor N14, transistor N15 and resistor R25. This current is provided through transistor P7 and transistor N17 to transistor N18. Transistor N19 mirrors the current from transistor N18 to sink bias current in the current steering comparator of transistor N20 and transistor N21. The current will be directed through either the collector of transistor N20 or the collector of N21 depending on which transistor has a higher base to emitter voltage.

It is desirable to avoid jitter when the base voltages of transistors N20 and N21 cross a trip point. The high gain of the Schmitt trigger helps this by rapidly switching the current path to the third transistor N12, thus changing the trip point and increasing the voltage imbalance on the bases of transistors N20 and N21. As the enable threshold for the undervoltage lockout circuit is approached, the difference in voltage $\Delta v_o$ between the base of transistor N21 and the base of transistor N20 is negative. As the $\Delta v_o$ becomes smaller approaching zero, the trip point is reached. The trip point is reached while $\Delta v_o$ is still negative. Ideally, $\Delta v_o$ is zero at the trip point, but in actuality this is not achieved. In order to compensate for the temperature coefficient of $\Delta v_o$ at the trip point, the current source formed by transistors N5, N6, N14, N15 and R25 has a positive temperature coefficient. The current source is designed to provide a current of Vt×ln(4)/R25. When transistor N21 is conducting, transistor P2 conducts thus turning on the current supply to the rest of the integrated circuit formed by transistors P3, P4. This enables the rest of the integrated circuit including the Vreg regulator and the charging current to the ramp terminal. Also, transistor P1 is turned on providing a short around transistor N1. This eliminates transistor N1 from the detection leg when the integrated circuit is enabled.

A description of the operation of the undervoltage lockout circuit will now be described. The supply voltage Vcc starts off low. As the supply voltage increases, the detection leg has substantially no current, only a few microamps, flowing through it. When the supply voltage approaches 4.2 volts, the current source composed of transistor N14, transistor N15, transistor N5, transistor N6 and resistor R25 begins to conduct. In the interval between the supply voltage reaching 4.2 volts and until the undervoltage lockout enable threshold is reached, roughly 150 microamps flows through the undervoltage lockout circuit. A trip point is reached when the detection voltage across resistor R20 equals Vt×ln ((emitter area of N12+the emitter area of N13)/(emitter area of N11)). At this point, the voltage at the bases of transistors N20 and N21 change sharply causing transistor P2 to conduct. The current to the third transistor N12 at this point shifts to the first current path through resistor R23 and transistor N9. The integrated circuit is now enabled. Transistor P1 goes into saturation and shorts out the diode N1. In terms of the supply terminal voltage, at the enable trip point, the supply voltage equals approximately $((R21+R20+R22)/R20) \times Vt \times \ln((\text{emitter area of N12} + \text{the emitter area of N13})/(\text{emitter area of N11})) + 6\,Vbe$.

With the supply voltage above the enable threshold, the integrated circuit is active. Since the diode N1 is shorted out and the hysteresis created by shifting the current through the third transistor N12 from the second current path through resistor R24 to the first current path through resistor R23 reduces the effective $\Delta$ Vbe required for the bases of transistors N20 and N21 to switch, the undervoltage lockout disable threshold is lower than the undervoltage lockout enable threshold. For the hysteretic differential comparator, the detection voltage across resistor R20 for switching the undervoltage lockout circuit to disable is approximately equal to $Vt \times \ln((\text{emitter area of transistor N13} - \text{the emitter area of N12})/(\text{emitter area of N11}))$. At this trip point, the disable voltage threshold at the supply terminal is equal to $((R21+R20+R22)/R20) \times Vt \times \ln((\text{emitter area of transistor N13} - \text{the emitter area of N12})/(\text{emitter area of N11})) + 5\,Vbe$. The thresholds set by the differential hysteretic comparator are advantageously determined by the emitter areas of the first transistor N11, the second transistor N13 and the third transistor N12. The enable threshold for the supply terminal is higher than the disable threshold in the $Vt \times \ln$ term which has a positive temperature coefficient. On the other hand, the enable threshold for the supply terminal is also higher than its disable threshold by the Vbe of semiconductor junction N1. The Vbe has a negative temperature coefficient. The positive and negative temperature coefficients substantially cancel each other out. Therefore, the difference between the enable threshold for the supply voltage and the disable threshold for the supply voltage is substantially temperature independent. Moreover, the enable and disable thresholds themselves are each substantially temperature independent. By removing the diode N1 from the detection leg when the circuit is enabled, the positive temperature coefficient of Vh for the hysteretic differential comparator is temperature compensated to achieve temperature independence.

Sleep Terminal

Figure 3:
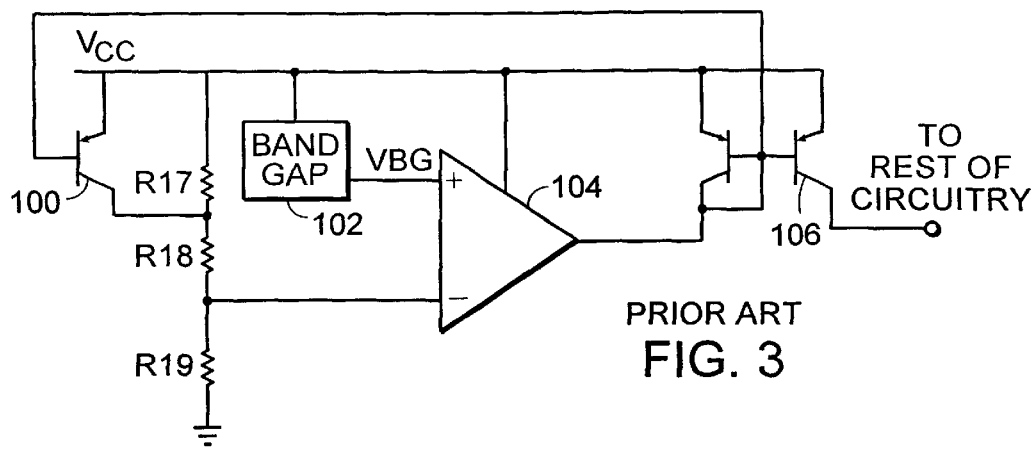
FIG. 3 is a schematic block diagram of a conventional under voltage lockout circuit which may be used in a programmable delay switch integrated circuit of the present invention.
Figure 6:
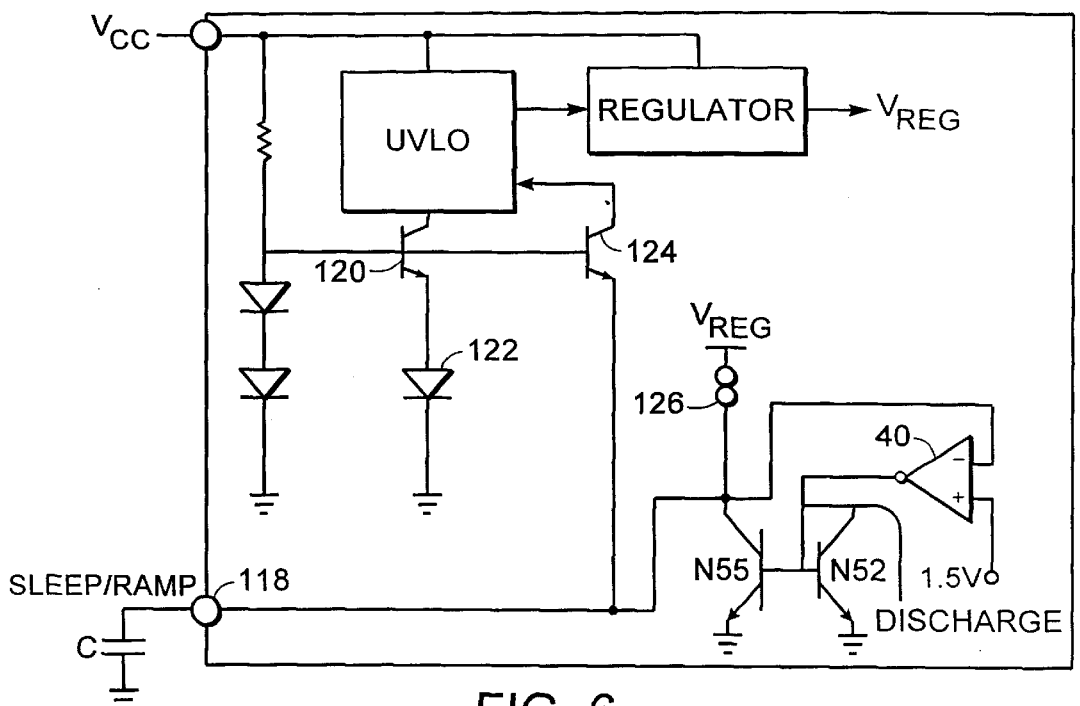
FIG. 6 is a schematic block diagram of an embodiment of a dual function sleep/ramp pin of the present invention.
Figure 7:
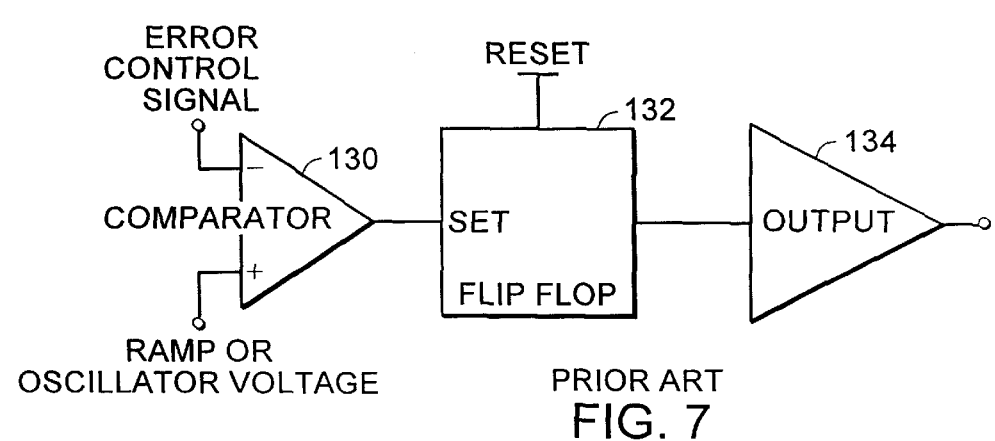
FIG. 7 is a schematic block diagram of a conventional method for latching the output of a comparator.

In accordance with a present embodiment, a sleep mode may be attained by taking advantage of the function of the undervoltage lockout circuit. The undervoltage lockout circuit maintains the integrated circuit in a disabled state in which the integrated circuit has no access to current. Not until the supply voltage reaches an enable threshold will the undervoltage lockout circuit permit current to the integrated circuit. Referring to FIG. 6, a sleep terminal 118 is provided on the integrated circuit to allow forcing the undervoltage lockout circuit to disable the integrated circuit at anytime by holding the sleep terminal 118 below a predetermined voltage threshold. The sleep terminal of this embodiment may function with any suitable undervoltage lockout circuit including the conventional undervoltage lockout circuit of FIG. 3 and the undervoltage lockout circuit of the preferred embodiments.

A transistor 120 has a collector connected to the undervoltage lockout circuit. The transistor is a bias current transistor in the presently preferred embodiment. The base of the bias current transistor is coupled to the voltage supply terminal Vcc. The emitter of the bias current transistor is connected through a semiconductor junction 122 to ground. A sleep switch is provided by sleep transistor 124 with its base connected to the base of the bias current transistor. The sleep transistor 124 provides a base-emitter semiconductor junction between the base of the bias current transistor 120 and the sleep terminal 118. The base-emitter semiconductor junction of the bias current transistor and the semiconductor junction 122 combine to clamp the base of the sleep transistor 124 at about 2 Vbe's. When the sleep terminal 118 is above 1 Vbe, the sleep transistor 124 is reverse biased and thus does not interfere with the normal operation of the integrated circuit. Only when the sleep terminal 118 is externally forced below 1 Vbe will the sleep transistor 124 have an impact. As the base of the sleep transistor 124 is brought below the clamped two Vbe's, the bias current transistor becomes reverse biased and is unable to conduct current through its collector. By bringing the sleep terminal 118 low enough, about 0.3 v, current through the collector of the bias current transistor 120 is completely cut off. With the loss of bias current, the undervoltage lockout circuit is disabled thereby shutting off all current to the integrated circuit. Any regulator or current supply on the integrated circuit is completely shut down. The sleep terminal could also be implemented without the semiconductor junction voltage of semiconductor junction 122. However with the base of the sleep transistor 124 clamped at only 1 Vbe above ground, the sleep pin needs to be held below ground to completely implement the sleep mode. Therefore, it is preferred that the base of the sleep transistor have a clamped voltage of 2 Vbe's or more.

Since in normal operation the sleep transistor 124 has no impact on the circuit, the sleep terminal may be used for other functions in the integrated circuit. In this manner, multiple functions can be implemented on a single IC package pin. The pin count of the integrated circuit can thus be reduced. According to one embodiment of the invention, a combination sleep and ramp pin functions as the sleep terminal and the ramp terminal. As a ramp terminal, an external capacitor is intended for connection to the pin. The external capacitor is charged by a current source 126 which is, in turn, connected to a regulated voltage. In order to maintain the sleep function at the ramp pin, it is necessary that in normal operation that the ramp pin not fall below the predetermined voltage threshold for entering the sleep mode. Any of the known discharge clamps or the discharge clamp may be used to prevent the ramp pin from falling below a predetermined minimum during normal operation.

Referring back to FIG. 5, the sleep pin shall be described with respect to the presently preferred embodiment. Transistor N16 functions as the sleep transistor. The emitter of sleep transistor N16 is connected to the sleep pin, which in accordance with the presently preferred embodiment functions also as the ramp pin. The base of the sleep transistor N16 is connected to the base of the bias current transistor N14. Transistor N14 has an emitter that is connected through the semiconductor junction of transistor N6 to ground. The collector of transistor N14 conducts the bias current from the differential comparator of the undervoltage lockout circuit. As long as the sleep pin remains above 1 Vbe, sleep transistor N16 is reverse biased and does not further impact on the normal functioning of the integrated circuit. It is only when the sleep pin is forced below 1 Vbe that the base of the bias current transistor N14 is brought below 2 Vbe and the bias current transistor therefore becomes reverse biased. As the sleep pin is pulled below one Vbe, sleep transistor N16 steals current from transistors N17 and N18. This reduces the current and eventually shuts off current through transistor N19. This disables the comparator formed by transistors N20 and N21. Thus, transistor P2 is off disabling the current source P3, P4. Without current on the integrated circuit, all regulators and current sources connected thereto on the integrated circuit are also shut off. When the sleep pin is low enough, about 0.3V, the bias current is completely prevented from flowing from the undervoltage lockout circuit thereby completely disabling that circuit. The only current flowing during a sleep mode forced at the sleep pin is the microcurrent through the detection leg. With current through transistor N14 shut off, the PNP transistor P5 is likewise shut off. However, should any leakage current flow through transistors P5, P6 or P7, such current will be sinked through the sleep transistor N16 during the sleep mode.

Of course, it should be understood that various changes and modifications to the embodiments described above will be apparent to those skilled in the art. For example, the sleep pin may perform any of a number of functions instead of or including as a ramp pin. Any number of differential comparator schemes may be used to detect voltage thresholds across a resistive portion of a detection leg. These and other changes can be made without departing from the spirit and scope of the invention and without diminishing its attendant advantages.

Comparator with Latch

Figure 8:
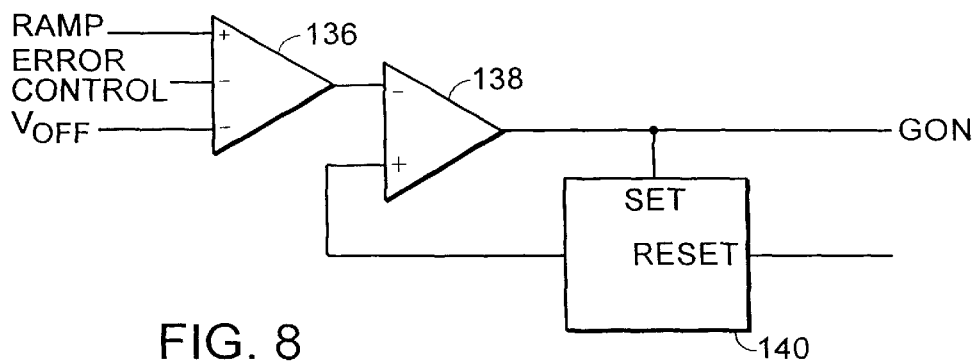
FIG. 8 is a schematic block diagram of an embodiment of a high speed latchable comparator for use in the programmable delay switch integrated circuit of FIG. 2.

In FIG. 8, a simple block diagram illustrates the basic circuit blocks and functioning of an embodiment of a comparator with latch. A first comparator 136 is used in the standard manner to compare a ramp signal with an error control voltage signal. The ramp signal is connected to the timing capacitor. The error control signal is received from the error amplifier. The presently preferred embodiment for use in the switch with programmable delay integrated circuit includes a Voff signal. Voff is derived from the secondary voltage signal $V_{sy}$. Voff is synchronous with and inverse to $V_{sy}$. Voff switches between 1.3 volts when $V_{sy}$ goes high and the ramp pin is charging and 1.9 volts when $V_{sy}$ goes low and the ramp pin goes low. Voff and the error control signal are connected in parallel. Thus, the comparator 136 compares the ramp voltage with the higher of the error control voltage and Voff. Under normal conditions, when the ramp signal is low or inactive, it is at a level between the high and low signals produced at Voff, about 1.5 volts, for example. Thus, when the ramp is low, Voff is above the ramp voltage and makes sure that the comparator does not generate a signal to switch on the output driver of the integrated circuit. The Voff also functions to operate the comparator during start up when the error control voltage is below the Voff. The output of the first comparator 136 is either a high valued signal or a low valued signal. In the embodiment shown, the output is a high valued signal when the ramp voltage exceeds both the error control voltage and the Voff.

A second comparator 138 may be referred to as a latching comparator. The second comparator 138 receives the output of the first comparator 136 at a first input. The output of the latching comparator 138 is representative of the output of the comparator as a whole. The output is used to switch the output driver. The output of the second comparator 138 is also the set input to a flip-flop like circuit block 140. The flip-flop block 140 has a reset input for receiving a reset signal. When the reset signal is in a nonreset state and the flip-flop block 140 receives the set state from the latching comparator 138, then a latch signal is generated and provided to the second input of the latching comparator 138. The latch signal has a voltage value that is outside of the range of voltages between the low valued signal and high valued signal generated by the first comparator 136. Thus, the state of the latching comparator 138 does not change when it is receiving the latch signal. The set signal at the output of the latching comparator 138 is maintained as long as the latch signal continues to be applied to the input of the latching comparator 138. When a reset signal is provided to the flip-flop block 140, the flip-flop block generates a comparator reference signal that has a voltage in between the low and high values from the output of the comparator 136. Thereafter, when the output of comparator 136 is below the reference comparator signal the latching comparator 138 changes to a "not set" state. When the reference comparator signal is recrossed by the output of the comparator 136 a set signal is provided again by the latching comparator 138 and an output signal is latched. The flip-flop block 140 is advantageously provided in parallel with the latching comparator 138 so as not to unnecessarily slow the propagation of the output to the switch being controlled.

Figure 9:
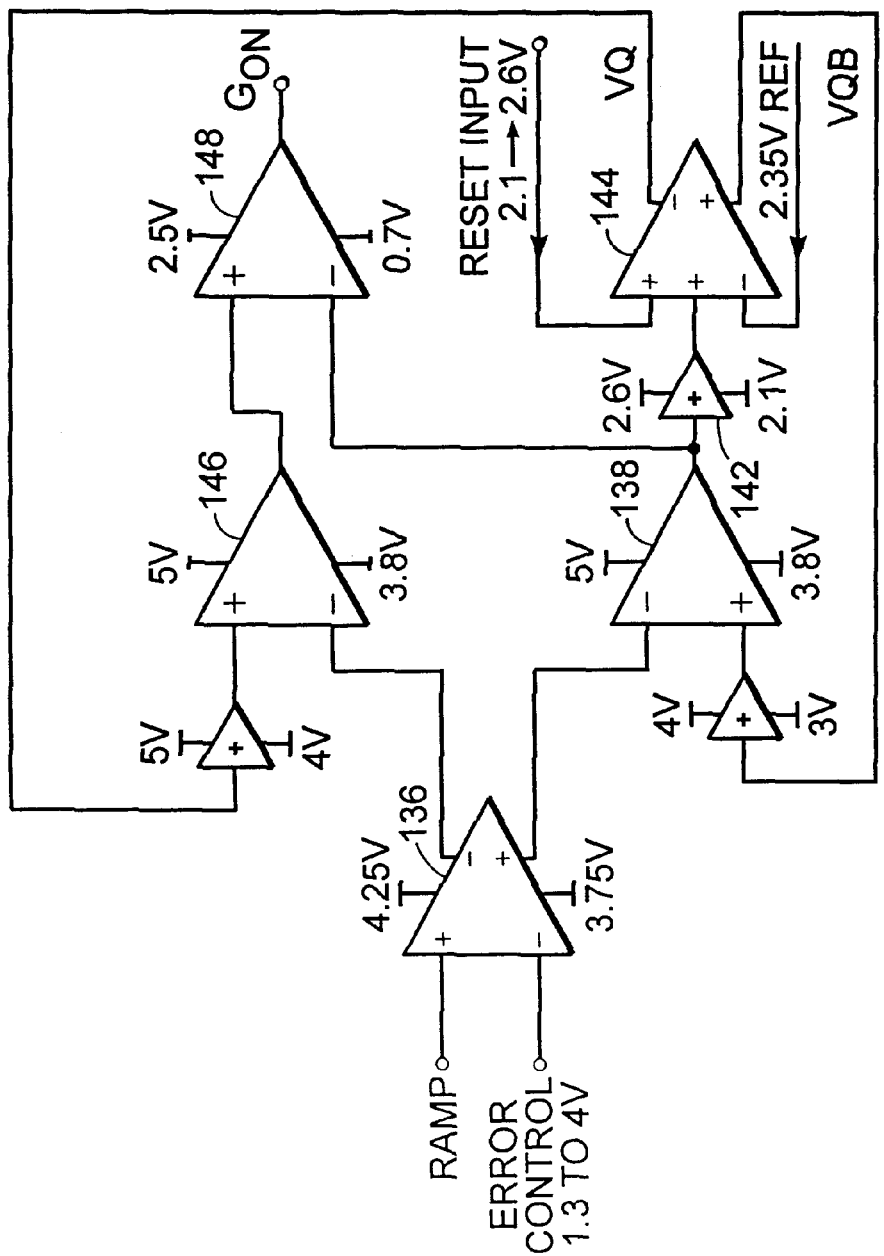
FIG. 9 is an alternate schematic block diagram of an embodiment of a high speed latchable comparator for use in the programmable delay switch integrated circuit of FIG. 2.

A presently preferred embodiment is shown in a block diagram of greater detail in FIG. 9. Here it is seen that the first comparator 136 generates either a high signal of 4.25 volts or a low signal of 3.75 volts. The comparator may have a positive output and an inverting output. When the positive output is high at 4.25 volts the inverting output is low at 3.75 volts. When the positive output is low at 3.75 volts the inverting output is high at 4.25 volts. The positive output from the first comparator 136 is provided to the negative input of the second comparator, latching comparator 138. When the ramp signal exceeds the error control signal and a high valued signal is provided by the first comparator, the second comparator 138 generates a signal in a first state. In the first state of the presently preferred embodiment, the second comparator 138 issues a low signal of 3.8 volts. A second state of the second comparator 138 provides a high signal of 5 volts in the presently preferred embodiment. When the second comparator receives a positive input that is higher than the input from the first comparator 136, the second comparator 138 generates a signal in the second state, a high signal of 5 volts. The output of the second comparator 138 is directly related to the switching control signal GON. When the output of the second comparator is in its first state, a low signal, the switching control signal GON is high. When the second comparator 138 is in its second state with a high signal, the switching control signal GON is low.

A voltage shifter 142 also receives the output signal from the second comparator 138. The voltage shifter 142 changes the range of the voltage signals from the second comparator. Instead of the initial range of 3.8 volts to 5 volts, the voltage range produced through the voltage shifter 142 is from 2.1 volts to 2.6 volts. The reset signal similarly varies between 2.1 volts and 2.6 volts. Both of these signals, the reset signal and the signal from the second comparator 138 are provided to a comparator 144. The comparator 144 acts like a flip-flop. A voltage reference is provided at the negative input of the comparator 144. The voltage reference is provided in between the low and high signals received from the voltage shifter and the reset input, a value of 2.35 volts in the presently preferred embodiment. The voltage reference is compared to whichever is higher, the reset input or the input from the voltage shifter 142. The comparator 144 issues latch signals when the reset input is in the non reset state and the output from the second comparator 138 is in its first state low signal. The comparator 144 is shown with two outputs, the positive output goes to the positive input of the second comparator 138. The latch signal on the positive output is a 3 volt signal. 3 volts is below the lowest value, 3.75 volts, that can be generated from the first comparator 136. If the reset signal is in the reset state or the output from the comparator 138 is in its second state, the comparator 144 generates a comparator reference signal on its outputs. The comparator reference signal falls in between the range of output signals from the first comparator 136. The comparator reference signal generated along the positive output from the comparator 144 is 4 volts to the input of the second comparator 138.

In the presently preferred embodiment, the switching control signal GON is used to switch components in the integrated circuit. Therefore, it requires a voltage range that includes a low signal close to ground and a high signal. A third comparator 146 and a fourth comparator 148 are included to achieve such a level shifted output signal. The third comparator 146 receives the inverting output from the first comparator 136. The positive input to the third comparator 146 comes from the inverting output of the comparator 144. The inverting output of comparator 144 provides either a latch signal at 5 volts or a comparator reference signal at 4 volts. The latch signal at 5 volts exceeds the highest value, 4.25 volts, that is generated by the first comparator 136. Thus, when the latch signal is being applied to the third comparator 146 the output of the third comparator 146 remains at a high signal of 5 volts. The low signal output of the third comparator 146 is 3.8 volts. A fourth comparator 148 receives the outputs from the second and third comparators. When the comparator circuit is being latched, the output from the second comparator 138 is a low signal at 3.8 volts and the output from the third comparator 146 is a high signal of 5 volts. This causes the fourth comparator 148 to generate a high signal on the switching control output. The switching control output from comparator 148 varies between a high signal of about 2.5 volts and a low signal of about 0.7 volts.

Figure 10:
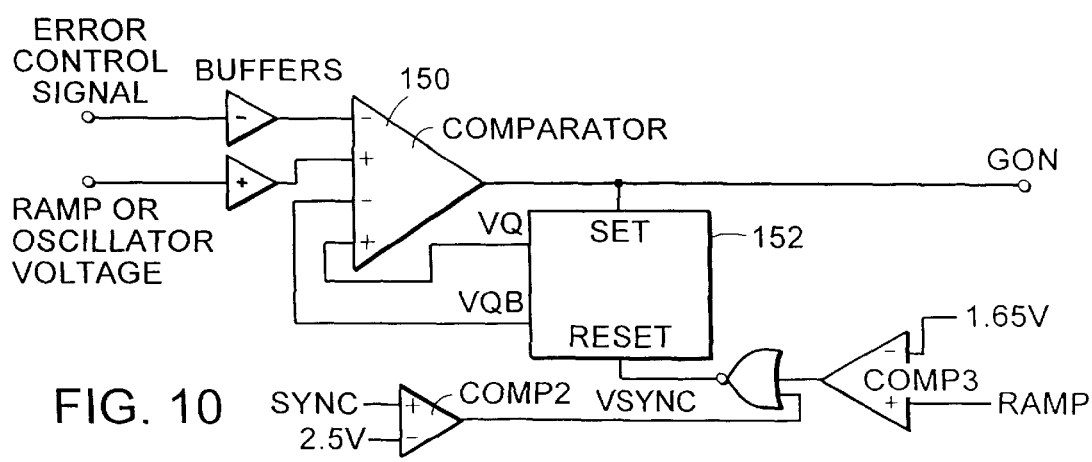
FIG. 10 is a still further alternate schematic block diagram of an embodiment of a high speed latchable comparator for use in the programmable delay switch integrated circuit of FIG. 2.

The circuit of FIG. 9 may be alternatively represented in the form shown in FIG. 10 Here, the first, second, third, and fourth comparators are combined in one block referred to as comparator 150. Comparator 150 is thus a four input comparator receiving the error control signal on a negative input, the ramp signal on a positive input and two signals on parallel positive and negative inputs from a flip-flop circuit 152. The flip-flop circuit 152 represents the actions of the comparator 144 from FIG. 9. Whenever the ramp input exceeds the error control signal input the output of the comparator 150 is in a first state. In this state, the output on the switching control signal GON is a high signal and the output to the set input of the flip-flop 152 is a low signal which causes the flip-flop to set. When the flip-flop 152 sets, latch signals are provided to the two additional inputs of the four input comparator 150. The latch signals cause the comparator 150 to latch with a high signal output to the switching control signal. The flip-flop 152 also has a reset input and receives a reset or non-reset signal. When a reset signal is received on the reset input, the latch signals are changed to reference comparator signals which permit the comparison to proceed between the error control signal and the ramp voltage. The error control input to the comparator 150 may be connected in parallel with a V-off signal to ensure that the comparator remains low when the ramp voltage is low and $V_{sy}$ is low even if the error control signal drops below the ramp signal's discharged level. The ramp voltage is compared to the error control signal or the V-off signal whichever is higher applied to the positive input of the four input comparator 150. The comparator 150 is unable to switch low until the flip-flop 152 receives the reset signal and resets the latch signals to reference comparator signals. Whenever the reset signal is being provided to the flip-flop 152 the comparator 150 merely acts as a comparator and no latching takes place.

Figure 11:
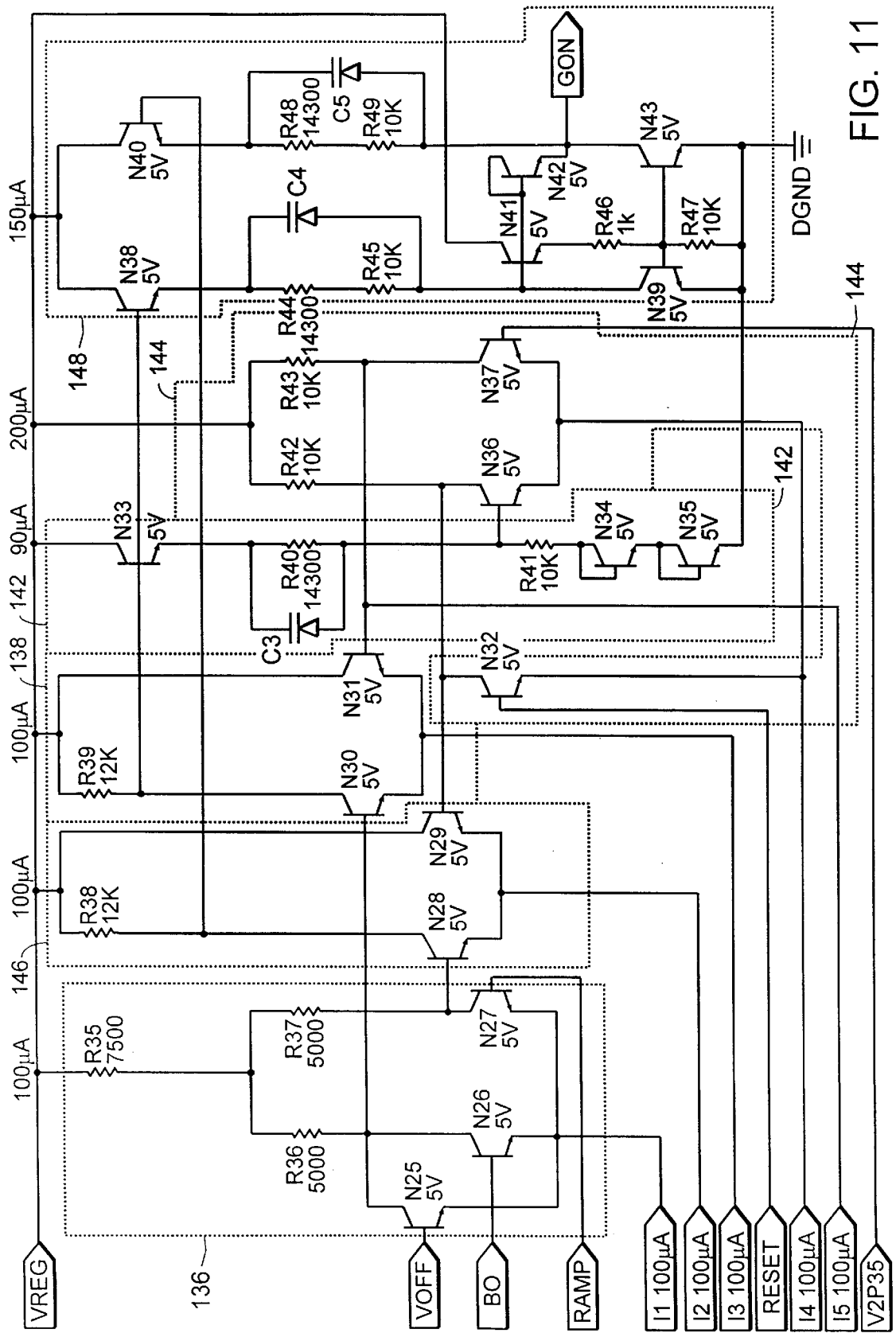
FIG. 11 is circuit diagram of the high speed latchable comparator of FIG. 9.
Figure 12A:
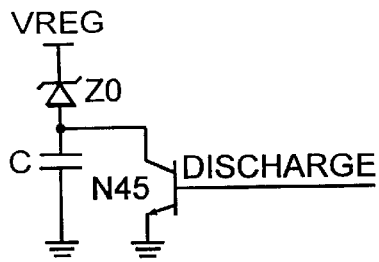
FIGS. 12A, 12B, 12C and 12D are schematic circuit diagrams of conventional methods for clamping the discharge level of a capacitor.
Figure 12B:
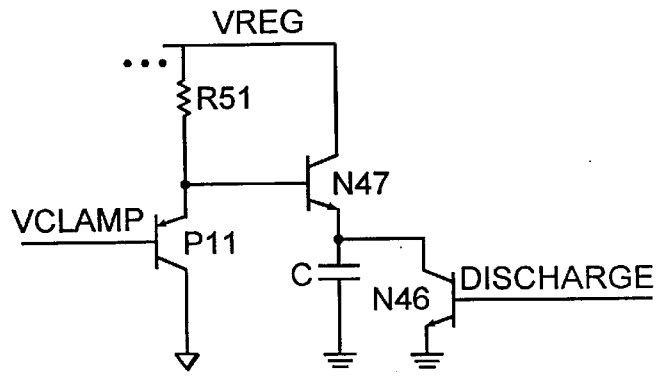
Figure 12C:
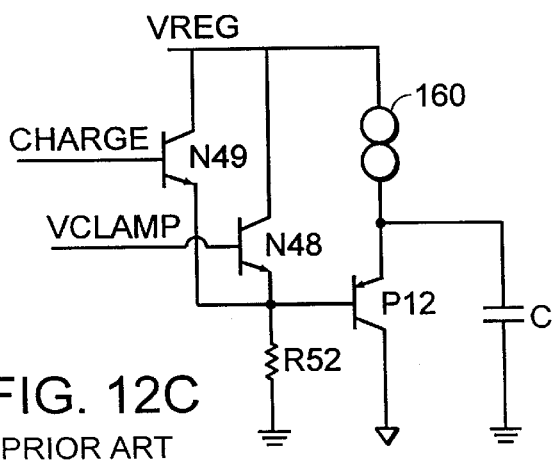
Figure 12D:
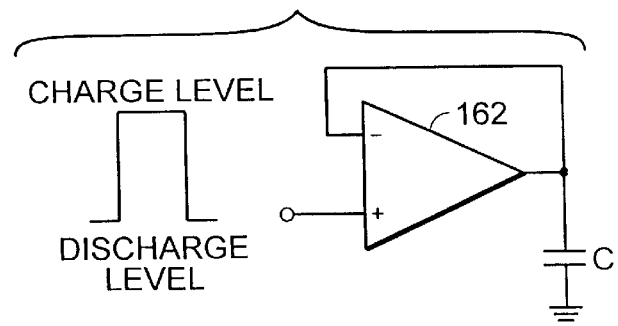

The currently preferred embodiment shall now be described in greater detail with regard to its circuit diagram shown in FIG. 11. The circuit is powered by a regulated voltage of 5 volts. The first comparator 136 is made up of transistors N25, N26, and N27 all having a common emitter connected to a current source sinking a current I1. Resistor R35 is the voltage shifting component for comparator 136. The base of transistor N27 is the positive input of the comparator and receives the ramp signal. Transistors N25 and N26 are in parallel and their bases receive the V-off signal and the error control signal B0 respectively. The error control signal has been generated by error amplifier EA1 and processed through buffer A2. The second comparator 138 is formed by transistors N30 and N31. Transistors N30 and N31 have a common emitter connected to current I3. The base of transistor N30 is connected to the positive output from the first comparator 136. The base of transistor N31 is connected to the positive output from comparator 144. The output of comparator 138 is applied to the base of transistor N33. Transistor N33, resistor R40, capacitor C3, resistor R41, transistor N34 and N35 all form the level shifter 142. The voltage swing from 3.8 volts to 5 volts at the base of transistor N33 is transformed into a voltage swing of 2.1 volts to 2.6 volts at the base of transistor N36. A rapid voltage change is transmitted quickly through current enhancement capacitor C3 to the base of transistor N36. The base of transistor N36 is a positive input for the comparator 144. The other components of comparator 144 include transistor N32 and transistor N37. Transistors N36 and N32 and N37 share a common emitter. The reset signal is provided to the base of transistor N32. A reference signal of 2.35 volts is provided to the base of transistor N37. Transistors N36 and N32 and N37 form a transconductance amplifier in which the voltages at the bases of these transistors is compared and results in output currents at the collectors of these transistor. A 100 microamp current I5 is pulled from the collector of transistor N37. This provides 1 volt across resistor R43 which is connected between the regulated voltage and the collector of transistor N37. Thus the output of the collector of transistor N37 varies between a high value of 4 volts and a low value of 3 volts. At the collectors of transistors N36 and N32 there is no current imbalance added to the output so the outputs vary between a full 5 volts from the regulated voltage to a low signal of 4 volts. The output from the transistor of N37 is provided to the second comparator 138 and serves either as the latch signal or the reference comparator signal. The output from the collectors of transistors N36 and N32 is provided to the third comparator 146 which is made up of transistors N28 and N29. These transistors have a common emitter. The base of transistor N28 is connected to receive an inverting output from the first comparator 136. The output from the third comparator 146 is provided to a comparator 148 which is formed by a differential to single ended level shifter. The differential inputs are provided to the bases of transistors N40 and N38. The current thereby generated across resistors R44 and R45 is compared to the current across resistors R48 and R49. If the current in resistors R44 and R45 is higher, the current mirror formed by transistors N39, N41 and N43 translates more current than is available in resistors R48 and R49. Therefore, all of the current from resistors R48 and R49 is pulled down through transistor N43 leaving none for the output signal GON which as a result goes low. If the current in resistors R44 and R45 is lower than the current in resistors R48 and R49, the output signal GON goes high. Transistors N42 and R46 form a clamp to keep the minimum voltage at one Vbe. Capacitors C4 and C5 are transient current enhancement capacitors for boosting speed. The switching control signal GON is taken from the collector of transistor N43. The signal varies between a low of 0.7 volts and a high of 2.5 volts.

The latchable comparator circuit operation will now be described. During startup or whenever the gate voltage of the FET being switched is low, it is desired to switch the output driver on as soon as the sync signal goes high and to continue to switch and hold the Output driver off when the sync signal falls low. To achieve this result a Voff signal has been added in parallel with the error control signal. Whenever the error control signal is out of the picture such as during startup, if the Voff signal was DC and was set above the ramp signal when the ramp is low, there would be a delay in the turn on between beginning to charge the ramp and having the ramp cross the Voff signal. To overcome this delay, the Voff signal is advantageously provided as a switching signal. This permits the error control DC level to be set below the ramp's discharged level when the sensed voltage is low during startup, for example. When the ramp is discharged, Voff is high (1.9 volts) and holds the comparator low. As soon as the sync signal goes high, Voff immediately falls below the ramp signal to a low of 1.3 volts. Thus, with the error control signal in the low condition characteristic of startup or a low gate voltage, the comparator can immediately switch high without waiting for the external timing capacitor to charge up the ramp voltage.

When the ramp voltage at the base of transistor N27 reaches the voltage at the higher of the base of transistor N25 or transistor N26, the base of transistor N28 is lowered from 4.25 volts to 3.75 volts. At the other output of the first comparator 136 the base of transistor N30 is raised from 3.75 volts to 4.25 volts. As the base of transistor N28 is brought down its collector voltage connected to the base of transistor N40 rises from 3.8 volts to 5 volts. As the base of transistor N30 rises its collector falls from 5 volts to 3.8 volts. As this brings the base of transistor N33 down the voltage level shifter 142 reduces the voltage at the base of transistor N36 from 2.6 volts to 2.1 volts. As the base of N36 drops below the 2.35 reference level the output of comparator 144 at the base of transistor N29 rises from 4 volts to 5 volts. Likewise, the other output at the base of transistor N31 goes from 4 volts to 3 volts. At this point, the output of comparator 148, the switching control output has risen to its high level of 2.5 volts. Now that the base of transistor N28 cannot rise above the voltage at the base of transistor N29 and the base of transistor N30 cannot drop lower than the voltage at the base of transistor N31, the comparator made up of transistors N25, N26, and N27 is basically disabled. The switching control output GON is latched high. The output signal will go low only when the ramp voltage at the base of transistor N27 drops below the V-off or the error control voltage B0 and the reset pin goes above the 2.35 volt reference.

Protection Circuity through the Reset Signal

The reset signal may simply be provided as an indication of a discharged timing capacitor. This function is achieved with a comparator (COMP3) shown in FIG. 2, which compares the ramp input of the first comparator 136 with a voltage threshold of 1.65 volts. When the ramp voltage is above 1.65 volts a reset signal is prevented. When the ramp signal falls below 1.65 volts a reset signal is permitted. However, an additional constraint has been added to the reset signal to further protect the output driver transistors.

A comparator COMP2 compares the sync signal with a voltage threshold of 2.5 volts. Only when the sync signal, a divided down version of $V_{sy}$, has fallen below the threshold of 2.5 volts and the ramp voltage has fallen below its threshold will a reset signal be generated. This provides protection for a situation in which sync signal is high and the ramp input is brought low because of an error, a short or a purposeful attempt to put the circuit in sleep mode. Under such conditions, the output is kept latched high. This prevents the gate of the FET $Q_s$ from being grounded when the high $V_{sy}$ voltage is present on the drain of the FET $Q_s$ and consequently on the source of the FET $Q_s$. Not until $V_{sy}$ goes low will reset be permitted.

Of course, it should be understood that various changes and modifications to the preferred embodiments described above will be apparent to those skilled in the art. For example, so long as the overall circuit produces the desired logical output, it does not matter whether a high or low signal is being produced by any given comparator. It is well within the ordinary skill in the art to reverse the highs and lows. Likewise, the voltage ranges used for the comparators may be changed to suit the specific design requirements of a circuit. If high speed is not required the flip-flop like block may use an actual flipflop to achieve the latching. These and other changes can be made without departing from the spirit and scope of the invention and without diminishing its attendant advantages.

Discharge Clamp

Referring now to FIG. 6, a basic schematic of the discharge clamp of a present embodiment is shown. The integrated circuit is provided with a ramp pin for connection to an external capacitor C. A discharging transistor N55 is coupled between the ramp pin and ground. Discharging transistor N55 has a collector connected to the ramp pin, a base, and an emitter connected to ground. A discharge signal is coupled to the base of the discharging transistor N55. In the presently preferred embodiment, the discharge signal is derived from the sync signal.

A differential amplifier 40 has a first input connected to a reference clamp voltage. In the embodiment shown, the first input is the positive input of the differential amplifier. The other input of the differential amplifier forms the feedback loop. This inverting input of the differential amplifier shown is coupled to the ramp pin and to the collector of the discharging transistor N55. The output of the differential amplifier is also coupled to the discharging transistor completing the loop.

A mirror transistor N52 provides a semiconductor junction between the output of the differential amplifier and ground. The mirror transistor N52 has a collector connected to the output of the differential amplifier, a base connected to the base of the discharging transistor and an emitter coupled to ground. The mirror transistor N52 and the discharging transistor N55 act as a current mirror.

A current source for charging the external capacitor C is provided at the collector of the discharging transistor N55. When the discharge signal is provided to the base of discharging transistor N55 so as to turn on the discharging transistor N55, the discharging transistor sinks the current from the current source and a discharge current from the capacitor C. The voltage on capacitor C is thus discharged through the discharging transistor N55. The capacitor continues to discharge until it drops to the reference clamp voltage. When the discharge signal has been pulled low at the base of the discharging transistor N55, discharging transistor N55 is off. At this time, the current source connected to the Vreg of the integrated circuit provides charging current to the external capacitor C.

Figure 13:
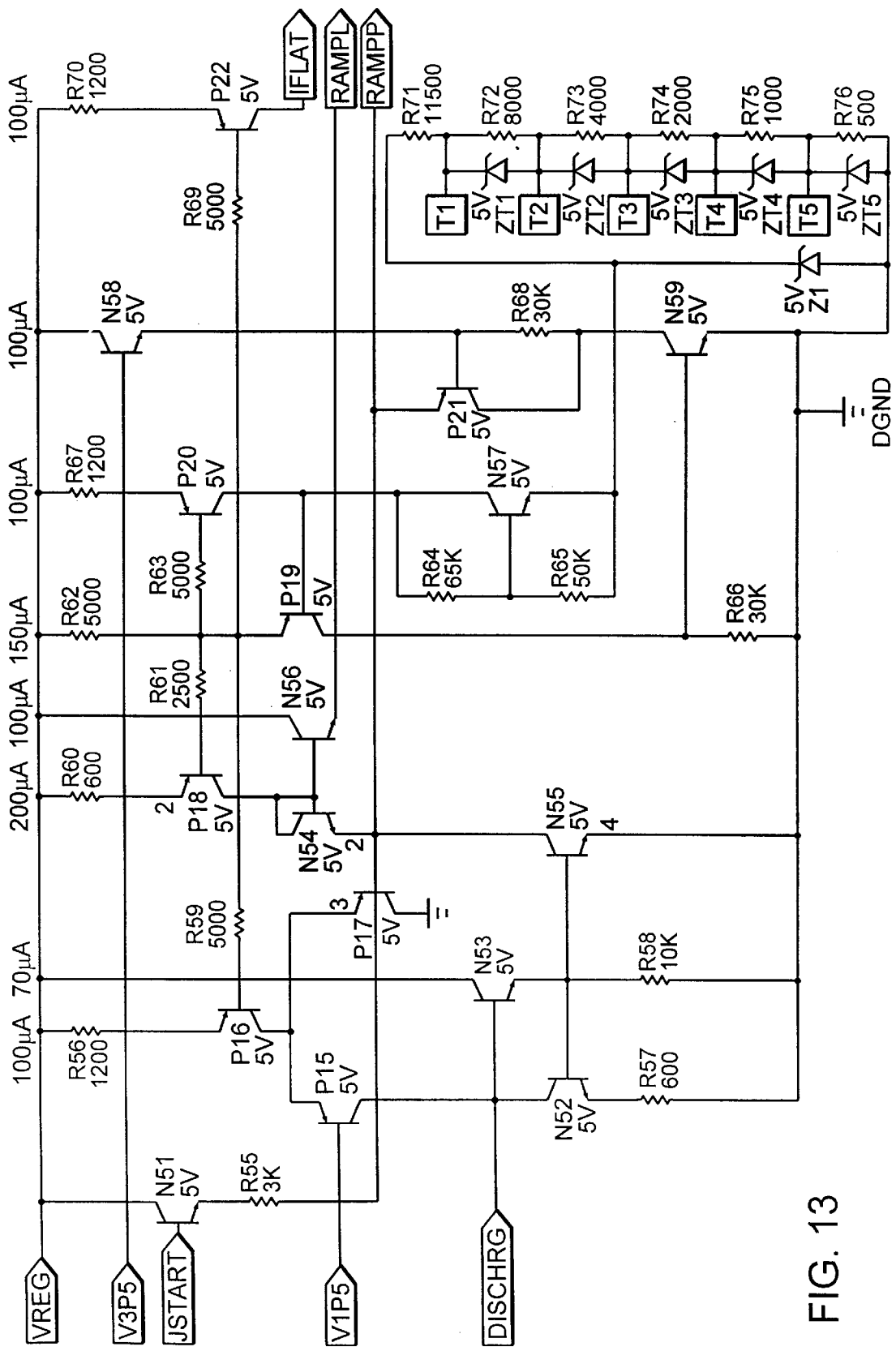
FIG. 13 is a circuit diagram of a presently preferred embodiment of a discharging clamp for a capacitor for use in the programmable delay switch integrated circuit of FIG. 2.

The differential amplifier of the presently preferred embodiment is a transconductance amplifier. Referring now to FIG. 13, a differential pair of transistors P15 and P17 provide the inputs to the transconductance amplifier. The base of transistor P15 is connected to the reference clamp voltage. In the presently preferred embodiment, this voltage is 1.5 volts. The emitter of transistor P15 is connected to the emitter of transistor P17. The common emitters are connected to a current source transistor P16. The collector of transistor P15 is the output of the transconductance amplifier. The base of transistor P17 is the inverting input of the transconductance amplifier. The collector of the discharging transistor N55 is connected to the inverting input at the base of transistor P17. The collector of transistor P17 is connected to ground. Mirror transistor N52 has its collector connected to the output of the amplifier at the collector of transistor P15. The output current through the mirror transistor N52 is mirrored in the discharging transistor N55. The emitter of the discharging transistor is four times in area compared to the emitter of the mirror transistor N52, thus the mirrored output current is equal to $I_{N52} \times 4e^{VR57/Vt}$ where $I_{N52}$ is the collector current of N52 and VR57 is the voltage across R57.

The voltage on the base of transistor P15 is the reference clamp voltage. The voltage on the base of transistor P17 is the voltage on the capacitor. The amplifier is balanced when voltage on the base of transistor P15 is about equal to the voltage on the base of transistor P17. A small error is required across the differential pair so that the current through transistor N52 exactly balances the current out of transistor P18. At this output current level, the charging current from current source transistor P18 is equal to the current being sinked through the discharging transistor N55. Thus, there is no additional current being pulled from the ramp pin. In the balanced state, the voltage on the ramp pin remains at 1.5 volts.

The discharge signal varies between being present with a high of 1.4 volts and being absent with a low value of 0.7 volts. When the discharge signal is absent and a low signal is applied to the base of bias transistor N53, the current mirror is shut off. Transistor N53 is off thereby depriving the discharging transistor N55 and the mirror transistor N52 of any base drive current. This removes the negative feedback of the differential amplifier effectively disconnecting the amplifier from the capacitor voltage. The capacitor can now be charged.

When the discharge signal is present, bias transistor N53 is on. Base drive current is thus provided to the current mirror. The differential amplifier is initially imbalanced with the ramp pin voltage at the base of transistor P17 higher than the reference clamp voltage at the base of transistor P15. Most of the current from current source P16 flows through transistor P15. This current is mirrored through discharging transistor N55 which pulls the current from the external capacitor and the charging current source. The capacitor continues to discharge until the amplifier reaches the balanced state. In the embodiment of FIG. 13, the upper limit of the capacitor is clamped by a PNP clamp including transistor N58 and transistor P21. The base of transistor N58 is fed with a fixed regulated voltage of 3.5 volts. The base of transistor P21 is down 1 Vbe from the 3.5 volts. The emitter of transistor P21 is up 1 Vbe from the base of transistor P21 setting the upper limit of the capacitor at 3.5 volts.

By including the PNP clamp, transistor P21 would provide a path from the ramp pin to ground during startup before the 3.5 volt reference is established. Since the ramp pin is doubling as a sleep pin, P21 would then hold the integrated circuit in sleep mode forever. To avoid this problem, transistor N59 is inserted between transistor P21 and ground to disable the PNP clamp when Vreg has not yet been established. The PNP clamp is not allowed to be grounded until Vreg turns transistor N59 on through resistor R66.

The present embodiment provides a "jump start" for the capacitor charging cycle. When the discharge signal goes low, the Jstart signal goes high. Jstart goes high faster than the discharge signal goes low. The Jstart signal varies between a high of 2.6 volts and a low of 2.1 volts. When Jstart goes high, transistor N51 turns on providing current through resistor R55 to initially charge the capacitor. Transistor N51 is turned off shortly thereafter when the voltage at its emitter goes higher than its base. Thereafter, the current source including transistor P18 provides the charging current for the ramp capacitor.

Transistors N54 and N56 provide a buffer to separate the external ramp pin from the internal circuitry. The ramp pin is connected to the emitter of transistor N54. The emitter of transistor N56 provides a buffered version of the capacitor voltage for use in the integrated circuit logic. The current in the current source P18 is mirrored from the current through transistor P20. The current through transistor P20 is determined by the Vbe multiplier made up of transistor N57 and resistors R64 and R65. The trim resistors R71, R72, R73, R74, R75 and R76 further contribute to the current in the current source. The trim resistors provide a means for adjusting the current to get the desired value.

Of course, it should be understood that various changes and modifications to the preferred embodiments will be apparent to those skilled in the art. For example, the clamp may be rearranged to accommodate attaching the reference clamp voltage to the inverting input of the differential amplifier. These and other changes can be made without departing from the spirit and scope of the invention and without diminishing its attendant advantages.

Totem Pole Driver

Figure 14:
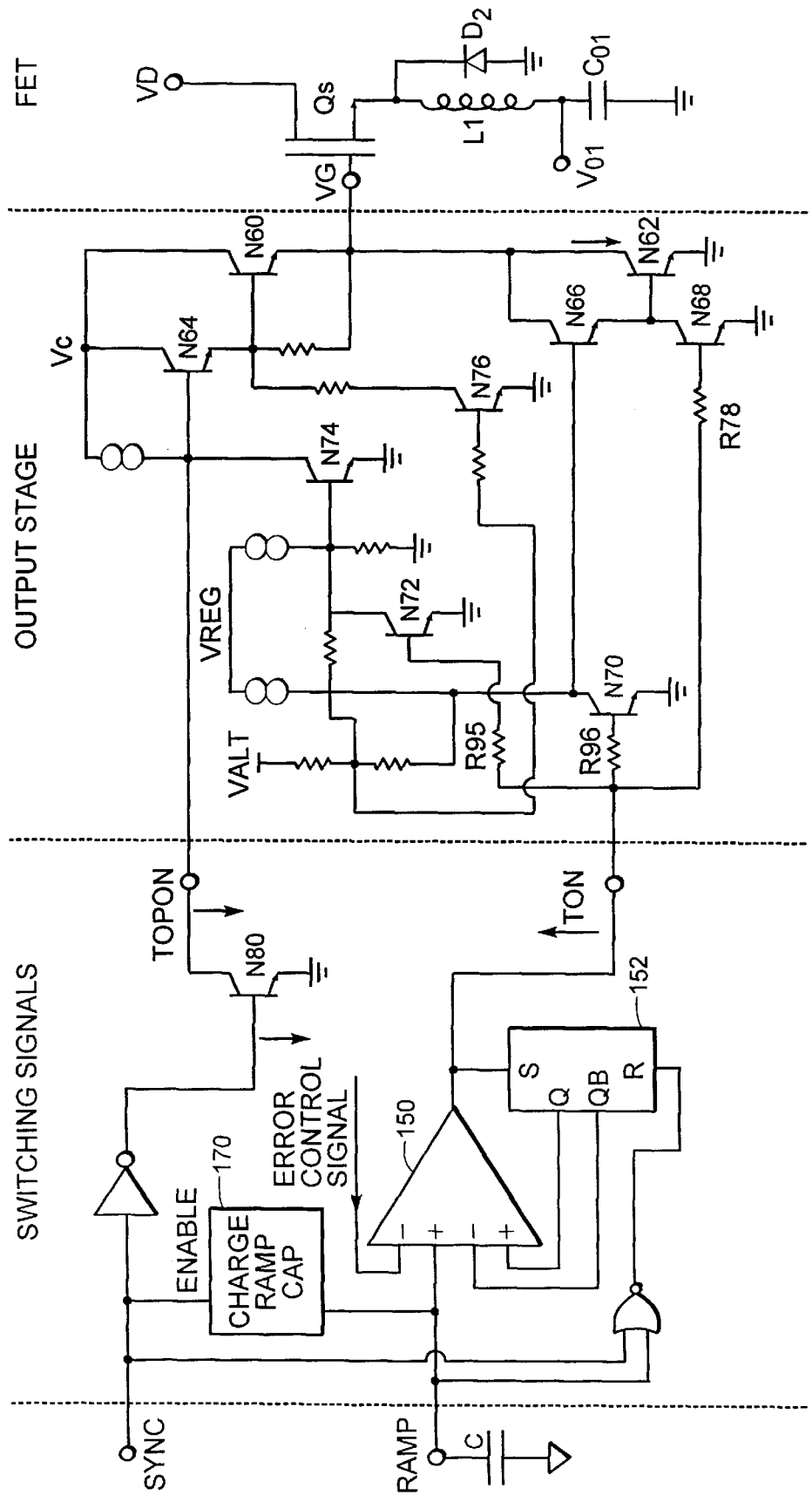
FIG. 14 is a schematic block diagram of an embodiment of a grounded totem pole driver with cross conduction protection and default low impedance state output for use in the programmable delay switch integrated circuit of FIG. 2.
Figure 15:
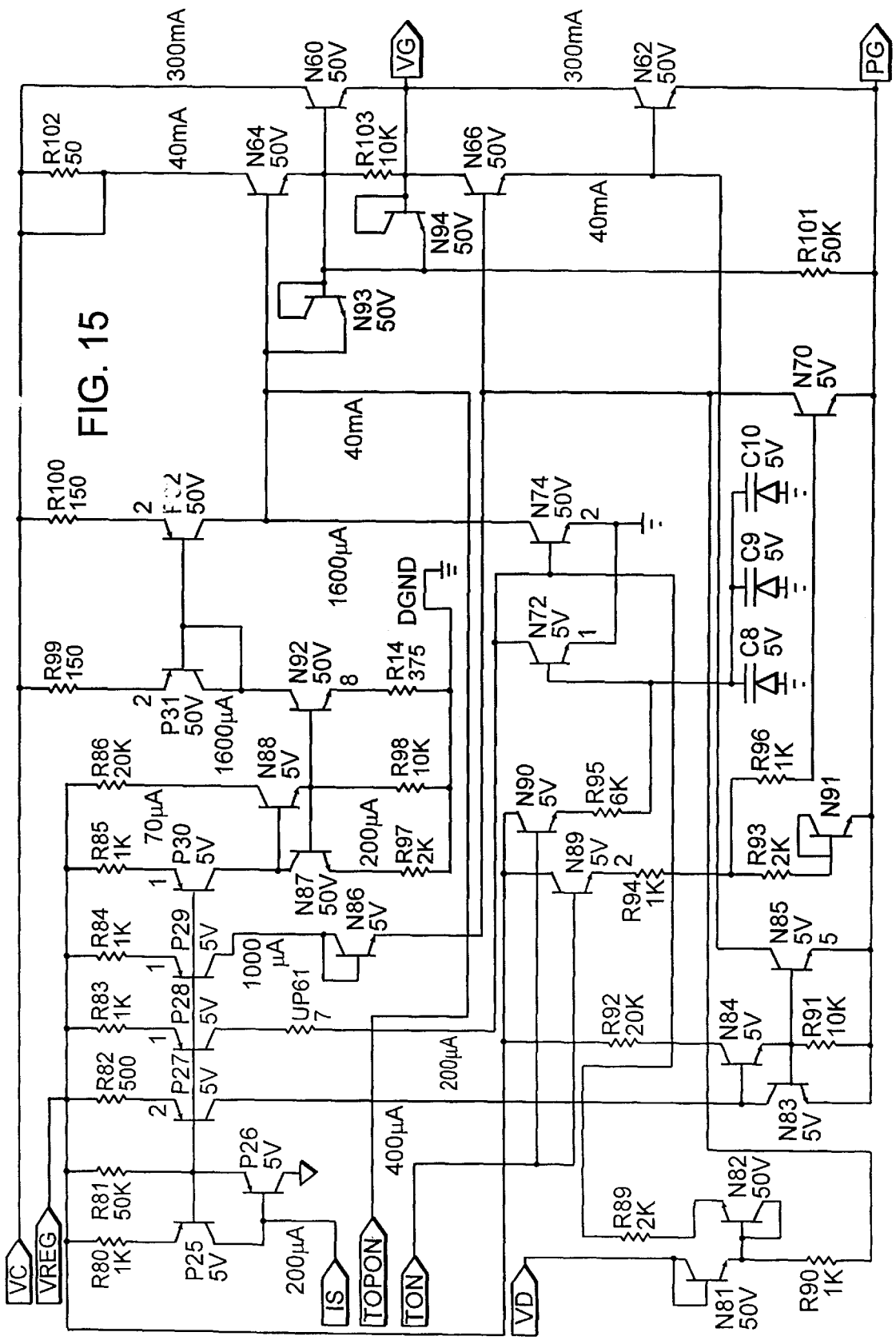
FIG. 15 is a circuit diagram of an embodiment of an output driver for use in the programmable delay switch of FIG. 2.

Referring now to FIGS. 14 and 15, the totem pole driver will be described. The totem pole driver includes a bottom output transistor N62 and a top output transistor N60. In the embodiment shown, in which the output transistors are NPN bipolar transistors, the top output transistor N60 has a collector connected to the main voltage supply $V_c$. The acceptable operating range for a $V_c$ in the present embodiment for use in a secondary side post regulator controller is from 8V to 75V. The top output transistor N60 has an emitter which is connected to the collector of the bottom output transistor N62. The emitter of the bottom output transistor N62 is connected to power ground. When the totem pole driver is used in a secondary side post regulator controller to drive a FET, the totem pole output at the emitter of the top output transistor N60 is connected to the gate of the FET.

The totem pole driver has two signals for controlling the switching of the output transistors. The inputs include a switching signal TON derived from the GON signal output of comparator 150 and a sync signal known to lead the switching signal. In accordance with the embodiment of a secondary side post regulator controller, the sync signal is derived from the secondary pulse $V_{sy}$. The secondary pulse is used to alternately enable charging and discharging of an external timing capacitor connected to the comparator 150 for generating the switching signal. On the leading edge of the sync signal, the capacitor begins to charge until it crosses an error control input on the comparator 150 at which point the comparator 150 switches the switching signal. At the falling edge of the sync signal, the capacitor begins to discharge. Discharge of the capacitor cannot take place instantaneously. Resetting of the comparator 150 is prevented until the capacitor has been discharged. Thus, there is a delay following the falling edge of the sync signal until the comparator is reset. Therefore, the sync signal is known to lead the switching signal. The totem pole driver of the present embodiment takes advantage of this known leading signal to prevent cross conduction current in the totem pole output.

The switching signal proceeds through a first circuit path in the totem pole driver to switch the bottom output transistor on or off. A first circuit path for controlling the switching of the bottom output transistor N62 can be found through pass transistor N89, resistor R94, resistor R96, a sink transistor N70 and a base drive transistor N66. The sink transistor N70 may also be called a bottom switch transistor. The base drive transistor N66 has a base coupled to the regulated circuit voltage Vreg, a collector connected to the collector of the bottom output transistor and an emitter connected to the base of the bottom output transistor N62. The sink transistor N70 has a collector connected to the base of the base drive transistor N66 and an emitter connected to ground. The base of the sink transistor N70 is coupled to the pass transistor N89 through resistors R96 and R94. which reduce the amount of current used up by the sink transistor. The pass transistor N89 receives the switching signal from the comparator 150. The pass transistor N89 has a collector connected to the regulated circuit voltage Vreg. Thus, the proper switching operation of this circuit path relies upon the existence of a sufficient voltage on Vreg. When the sink transistor N70 is on in response to the switching signal, it pulls the base drive transistor N66 to ground shutting off base drive current to the bottom output transistor N62, thus shutting off the base drive transistor and the bottom output transistor. When the switching signal stops providing base current to sink transistor N70, the base drive transistor N66 and the bottom output transistor N62 are both on. The base drive transistor N66 and the bottom output transistor N62 are both pulling current from the totem pole output, in other words from the gate of the FET. Thus, the base drive transistor and the bottom output transistor act as a Darlington pair.

An alternate optional first circuit path, shown in the embodiment of FIG. 14 passes through resistor R78 to a bottom switch transistor N68. The bottom switch transistor N68 has a collector connected to the base of the bottom output transistor and an emitter connected to ground. The base of the bottom switch transistor N68 receives the switching signal. The resistor R78 reduces the amount of current used by bottom switch transistor N68. This alternate first circuit path may be used in addition to the first circuit path through sink transistor N70.

The output stage operates on current provided by current sources P27, P28, P29 and P30. The current from transistor P27 is provided to a current mirror formed by transistors N83 and N85. The collector of transistor N85 is connected to the base of the bottom output transistor N62 and the emitter of the base drive transistor N66. The constant current sink of transistor N85 helps to speed up the switching off of bottom output transistor N62. In addition, this current leakage path through transistor N85 adds a delay to switching on bottom output transistor N62. The permanent leakage path through transistor N85 requires that the bottom base drive transistor N66 have a substantial current in it before it actually turns on the bottom output transistor N62.

The totem pole driver includes a second circuit path for using the switching signal to switch the top output transistor on after the bottom output transistor is switched off. A time delay is provided along the second circuit path to avoid the cross conduction problem. The second circuit path includes pass transistor N90, resistor R95, the delay transistor N72 and a top switch transistor N74. Referring first to the top switch transistor N74, it has an emitter connected to ground, a collector connected to a supplier of base drive current (top base drive transistor (N64) to the top output transistor N60 and a base connected to the collector of the delay transistor N72. The base of the delay transistor N72 is also coupled to the switching signal. The resistor R95 reduces the amount of current carried by the switching signal to the base of the delay transistor. The emitter of delay transistor N72 is connected to ground and the collector of the delay transistor is coupled to the regulated circuit voltage Vreg.

Current from the main power voltage supply VC for driving the top base drive transistor N64 is provided by a top side current mirror including transistors P31 and P32. Resistors R99 and R100 act as simple degeneration resistors. The top switch transistor N74 acts to turn this current on or off to the top base drive transistor N64. When the top switch transistor N74 is on, the base of the top base drive transistor N64 is pulled to ground, shutting off base current to the top output transistor N60. The top base drive transistor N64 and the top output transistor N60 are arranged as a Darlington pair. The delay in getting the top switch transistor N74 to react to the switching signal imposed by transistor N72 can be increased by providing capacitors at the base of transistor N72. In the embodiment of FIG. 15, three optional capacitors, C8, C9 and C10, are shown for providing some additional propagation delay. The presently preferred embodiment includes a gain limiting leakage resistor R103 for the top output transistor N60. The leakage resistor of the preferred embodiment is 10 K Ohms.

Despite the delay in shutting off the bottom output transistor N62 caused by the leakage current through transistor N85, top base drive transistor N64 is too slow to first turn off the top output transistor N60 in response to a signal from comparator 150. In order to turn off the top output transistor before the bottom output transistor N62 turns on, a third circuit path is provided between the top output transistor N60 and a sync signal. The sync signal TOPON is derived directly from and is in phase with SYNC in the presently preferred embodiment. The sync signal—known to lead the switching signal—is provided in the present embodiment through a conductive path to the base of the base drive transistor N64. Thus, when the sync signal TOPON is low, the base drive transistor N64 is shut off shutting off drive current to the top output transistor N60. The switching signal then through the first circuit path turns the bottom output transistor N62 on. Since the SYNC signal is also responsible for initiating the discharge of the timing capacitor, the totem pole driver takes advantage of the delay between enabling the discharge of the timing capacitor and the resetting of the comparator 150 by the flip-flop like circuit 152 which, in turn, resets the switching signal.

In the event that the circuit loses power and there is no regulated circuit voltage Vreg, it is desirable that the totem pole output assume a low impedance state to ground. The objective is to shunt current away from any device on the output, such as the FET, to prevent such a device from burning out due to excessive current in a situation when the circuit has lost control. This safe failure mode is achieved in accordance with the present invention, by providing an emergency voltage supply. Such a voltage supply needs to be reliable and exist regardless of whether power is being provided to the integrated circuit chip. In the presently preferred embodiment of a secondary side post regulator controller, the emergency voltage supply is the drain pin of the FET device connected to the output of the totem pole driver. Thus, the emergency voltage supply shown in the drawings and indicated as VD, the drain pin of the FET, alternatively is shown as VALT which may be any reliable emergency supply. The drain pin is particularly useful since any time the FET is threatened by a voltage on its drain, that voltage itself is used to supply the protection circuitry.

The emergency voltage supply is provided through a transistor connected as a diode N81. The diode N81 is reverse biased to prevent current from going into the FET, when the drain pin of the FET is at a low impedance. A resistor (not shown) may also be included between the drain of the FET and the diode N81 to help limit the current. A fourth circuit path connects the emergency voltage to the base of the top switch transistor N74. Thus, when Vreg is turned off or removed from the circuit, the top switch transistor N74 is held on to pull the top base of the base drive transistor N64 to ground. This holds off the top output transistor N60. The fourth circuit path in the embodiment of FIG. 15 includes transistor N82 arranged as a diode and resistor R89. Transistor N82 acts as a level shifting device. Resistor R89 provides current limiting to the base of top switch transistor N74 when the drain of the FET goes high.

A fifth circuit path is provided so that the emergency voltage may hold the bottom output transistor on. In the embodiment of FIG. 15, this fifth path includes resistor R90 and base drive transistor N66. Resistor R90 provides current limiting to the base of the base drive transistor N66 when the drain of the FET goes high. A sink transistor N70 is also connected to the fifth circuit path. The sink transistor N70 shuts down this fifth circuit path when it is not desired to have the base drive transistor N66 on. In an emergency situation, the voltage from the emergency voltage supply is provided to the base of the base drive transistor N66 so that it and the bottom output transistor N62 are both conducting.

In the presently preferred embodiment, it is desired to prevent the FET from turning on due to drain to gate leakage current. To perform this function, a resistor R101 is connected between a diode N94 and ground. The resistor R101 is a leakage resistor that satisfies the function of preventing the FET from turning on due to drain to gate leakage current. Resistor R101 is a 50 K Ohm resistor in the presently preferred embodiment. The transistors N93 and N94 are configured as diodes. Transistor N93 is connected between the emitter and base of top base drive transistor N64. Transistor N94 is connected between the emitter and base of top output transistor N60. These diodes prevent the top base drive transistor N64 and the top output transistor N60 from breaking down during a reverse bias condition.

The circuit operation will now be described. When the circuit is inactive due to a fault condition or simply prior to powering up, the secondary pulse $V_{sy}$ is alive. This energy appears at the drain of the external FET which serves also as the emergency voltage supply at VALT. The emergency voltage supply through the fifth circuit path holds the Darlington pair of the bottom output transistor N62 and its base drive transistor N66 on to provide a path for the current in the FET gate source capacitor. The fourth circuit path holds the top output transistor N60 off.

As the supply voltage rises above the undervoltage lockout threshold of the integrated circuit chip, the circuit becomes active and Vreg turns on. Vreg is 5 volts in the present embodiment. The rising edge of the sync signal SYNC initiates the charging of the ramp capacitor. In this interval, a sync signal transistor N80 is turned off leaving the sync signal high at the base of the base drive transistor N64. As the ramp voltage on the capacitor crosses the error control signal, the switching signal from the comparator 150 goes high. The switching signal high state is latched by the flip-flop like circuit 152. This switching signal is delayed through the second circuit path. Propagation through the second circuit path requires turning on delay transistor N72 and charging of the collector capacitance on the top switch transistor N74. The delay in turning on the delay transistor N72 may be increased by providing any of the capacitors C8, C9 and C10. The bottom output transistor N62 is turned off first through the first circuit path including the bottom switch transistor N70. The top output transistor N60 is then turned on through the second circuit path.

Upon the occurrence of the falling edge of the sync signal SYNC the discharge of the ramp capacitor is initiated. The drop in the sync signal, which in this application is also connected to the drain of the external FET, causes the voltage on the gate of the FET to also drop sharply. For a very brief time, the top output transistor N60 is held on, but the falling edge of the sync signal also turns on sync signal transistor N80 providing a low signal which immediately turns off the supply of base drive current from base drive transistor N64 to the top output transistor N60, thereby turning off the top output transistor. The ramp capacitor discharges and reaches the point at which the latch for the comparator resets and the switching signal goes low. At this point, the first circuit path turns on the bottom output transistor N62. This discharges the gate source capacitor of the FET and the gate is forced low.

If at any point the integrated circuit's supply voltage Vcc is removed or Vreg is shorted to ground, the emergency voltage supply directs a portion of the secondary energy from the drain of the external FET to put the totem pole driver in a state keeping the gate of the FET at a low impedance. In other words, the bottom output transistor is held on and the top output transistor is held off. By bringing the base of top base drive transistor N64 to ground in a fault situation, the output transistors can withstand a higher breakdown voltage on voltage supply VC. This extends the range of VC that can be permitted during a fault mode.

Transistor N74 provides AC coupling to ground in the event of a high supply transient on the voltage supply VC.

Figure 16:
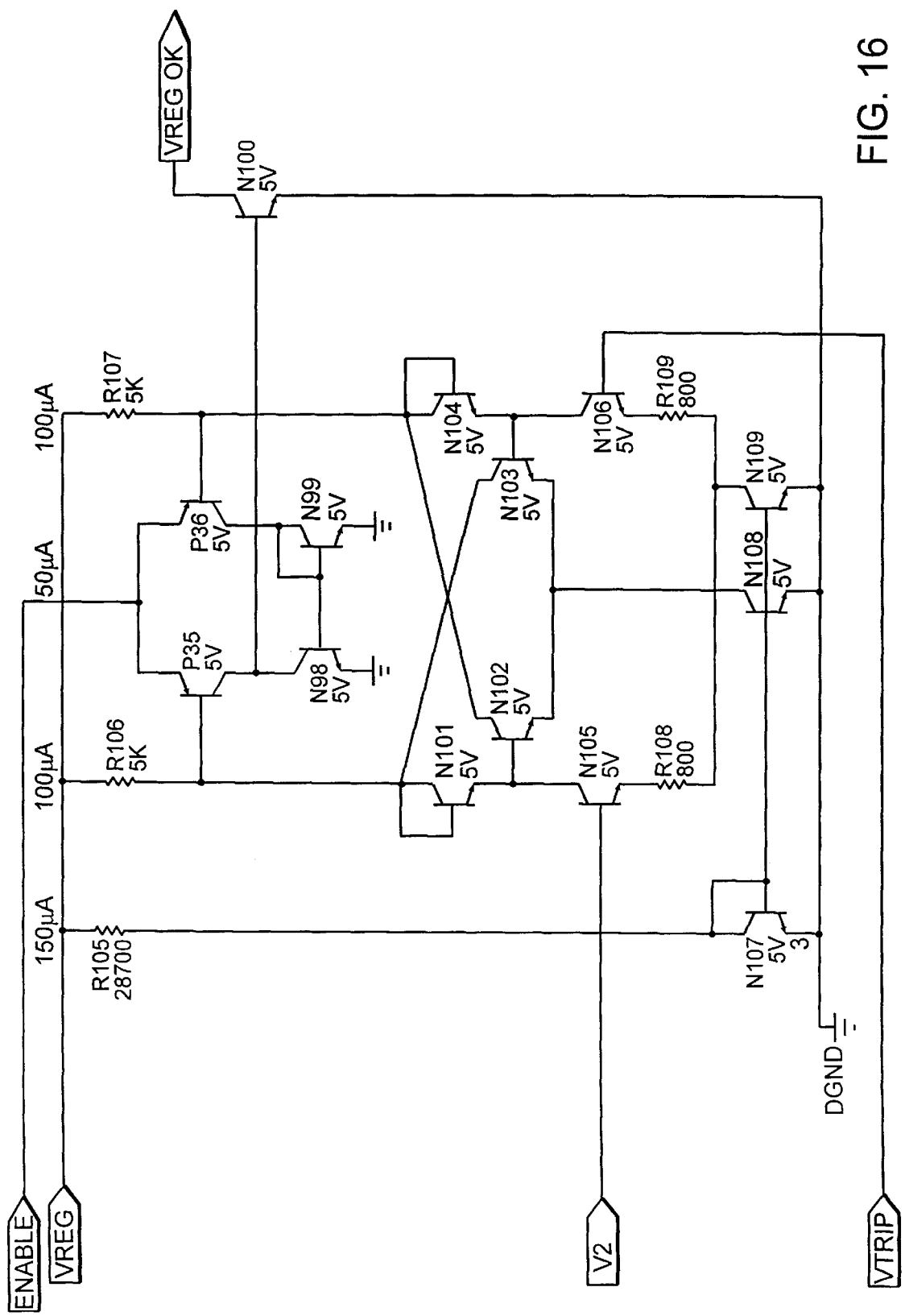
FIG. 16 is a circuit diagram of a fault detection circuit for use in the programmable delay switch of FIG. 2.
Figure 17:
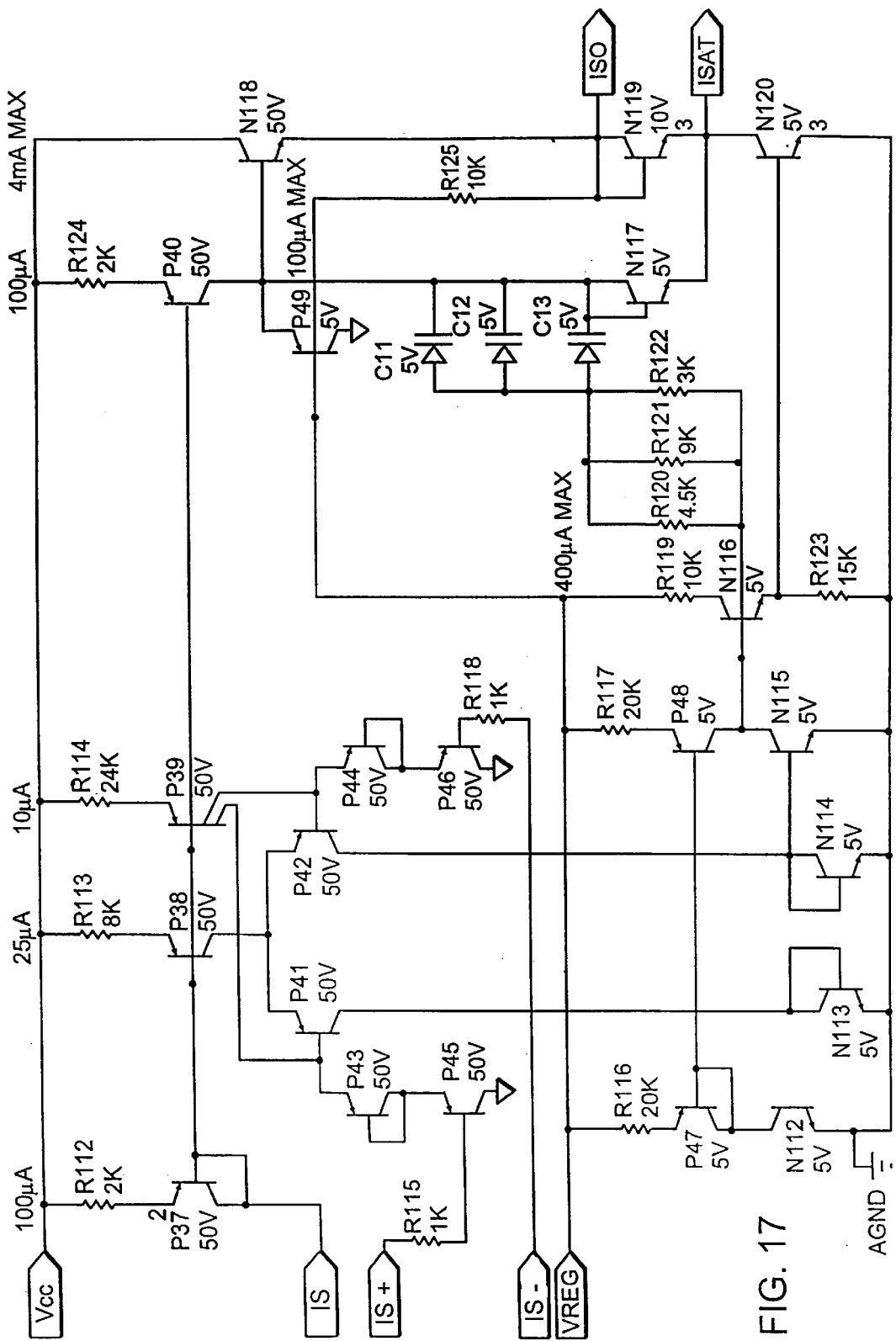
FIG. 17 is a circuit diagram of a current sense amplifier for providing overcurrent protection in the programmable delay switch of FIG. 2.
Figure 18:
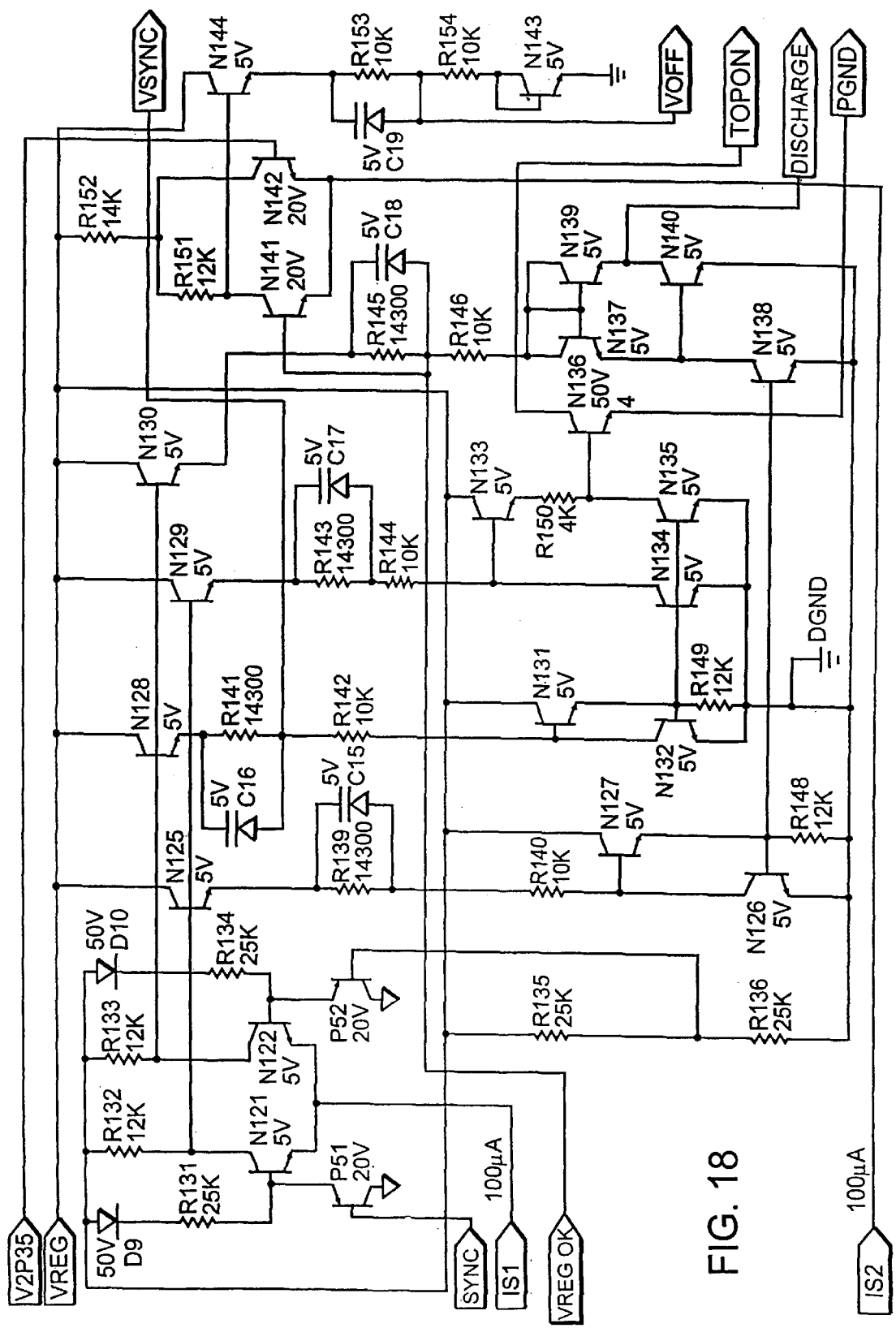
FIG. 18 is a circuit diagram of sync logic circuitry for use in the programmable delay switch of FIG. 2.

Some additional circuits contained within the switch with programmable delay 10 are also illustrated in the drawings. FIG. 16 shows the comparator COMP6 for generating the VregOK fault protection signal. FIG. 17 shows a current sense amplifier EA2 for use in the programmable delay switch 10 of the presently preferred embodiment. FIG. 18 illustrates some of the sync logic circuitry including comparator COMP2.

The embodiments of the invention are intended to be merely exemplary and numerous variations and modifications will be apparent to those skilled in the art. All such variations and modifications are intended to be within the scope of the present invention as defined in the appended claims.

We claim:

1. An integrated circuit comprising:
   an error amplifier, connected to receive a voltage sense signal and a reference signal, so as to produce an error control signal;
   a ramp node for providing a periodic ramp signal;
   a reset signal generator arranged so as to produce a reset signal;
   a comparator connected to receive the error control signal and the ramp signal for generating a first state signal or a second state signal depending upon a comparison between the error control signal and the ramp signal;
   a latch circuit coupled to said reset signal generator and to said comparator in order to latch the first state signal until the reset signal is received; and an output driver, connected to a first terminal and a second terminal, switched in response to the first and second state signals to drive an output signal on the first terminal in response to the first state signal and to provide a low impedance path between the first terminal and the second terminal in response to the second state signal.

2. The integrated circuit of claim 1 further comprising a current source and a discharge transistor coupled to said ramp node.

3. The integrated circuit of claim 1 further comprising a conductive line for receiving a sync signal corresponding to a voltage on a secondary winding and wherein said reset signal generator produces the reset signal when the ramp signal is below a first predetermined level and the sync signal is below a second predetermined level.

4. The integrated circuit of claim 3 wherein the ramp signal begins to rise in response to a leading edge of the sync signal.

5. The integrated circuit of claim 1 wherein said output driver comprises a totem pole driver, having a top output transistor and a bottom output transistor, to drive the output signal on the first terminal with the top output transistor on and the bottom output transistor off and to provide the low impedance path through the bottom output transistor between the first terminal and the second terminal.

6. The integrated circuit of claim 1 further comprising a current sense amplifier, connected to receive a current sense signal and a current limit reference signal and having an output coupled to said error amplifier, for sinking current from said error amplifier when an overcurrent condition is detected so as to cause the error control signal to rise above the ramp signal.

7. A switch with programmable delay comprising:
an error amplifier, connected to receive a voltage sense signal and a reference signal, for producing an error output signal;
buffer circuitry connected to receive the error output signal and produce an error control signal;
a current source and a discharge transistor for producing a periodic ramp signal;
a comparator connected to receive the error control signal and the ramp signal for generating a first state signal or a second state signal depending upon a comparison between the error control signal and the ramp signal;
a latch circuit connected to said comparator in order to latch the first state signal until a reset signal is received;
a current sense amplifier, connected to receive a current sense signal and a current limit reference signal and having an output coupled to said error amplifier, for causing, when an overcurrent condition is detected, said buffer circuitry to produce the error control signal relative to the ramp signal that causes said comparator to generate the second state signal; and
an output driver, connected to a first terminal and a second terminal, switched in response to the first and second state signals to drive an output signal on the first terminal in response to the first state signal and to provide a low impedance path between the first terminal and the second terminal in response to the second state signal.

8. The switch of claim 7 further comprising a diode connected between said current sense amplifier and said error amplifier to isolate said current sense amplifier from the error output signal when the current sense signal is below the overcurrent condition.

9. The switch of claim 7 wherein said output driver comprises a totem pole driver, having a top output transistor and a bottom output transistor, to drive the output signal on the first terminal with the top output transistor on and the bottom output transistor off and to provide the low impedance path through the bottom output transistor between the first terminal and the second terminal.

10. The switch of claim 7 further comprising a reset signal generator to produce the reset signal when the ramp signal is below a first predetermined level.

11. The switch of claim 7 further comprising a conductive line for receiving a sync signal corresponding to a voltage on a secondary winding and a reset signal generator to produce the reset signal when the ramp signal is below a first predetermined level and the sync signal is below a second predetermined level.

12. A switch with programmable delay comprising:
Vcc means for receiving a supply voltage;
a regulator connected to said supply voltage for generating a regulated voltage;
an error amplifier, connected to receive a voltage sense signal and a reference signal, for producing an error control signal;
a current source and a discharge transistor for producing a periodic ramp signal;
a comparator connected to receive a voltage from the error control signal and the ramp signal for generating a first state signal or a second state signal depending upon a comparison between the voltage from the error control signal and the ramp signal;
VregOK means for disabling said comparator when the regulated voltage is below a predetermined threshold;
a latch circuit connected to said comparator in order to latch the first state signal until a reset signal is received; and
an output driver, connected to a first terminal and a second terminal, switched in response to the first and second state signals to drive an output signal on the first terminal in response to the first state signal and to provide a low impedance path between the first terminal and the second terminal in response to the second state signal.

13. The switch of claim 12 further comprising an undervoltage lockout circuit for enabling said regulator when the supply voltage rises above an enable threshold and for disabling said regulator when the supply voltage falls below a disable threshold lower than the enable threshold.

14. The switch of claim 12 further comprising a sleep terminal and a sleep switch, coupled to said sleep terminal and said undervoltage lockout circuit, for causing said undervoltage lockout circuit to disable said regulator when said sleep terminal is below a predetermined sleep threshold.

15. The switch of claim 12 wherein said VregOK means comprises means for activating said discharge transistor.

16. The switch of claim 12 further comprising means for activating said discharge transistor in response to the supply voltage falling below the regulated voltage.

17. The switch of claim 12 further comprising a conductive line for receiving a sync signal corresponding to a voltage on a secondary winding and a reset signal generator to produce the reset signal when the ramp signal is below a first predetermined level and the sync signal is below a second predetermined level.

18. A secondary side post regulator comprising:
a conductive line for receiving a sync signal corresponding to a voltage on a secondary winding;

a programmable delay circuit, connected to receive a sense signal corresponding to a voltage at an output of a switching device, for generating a first state signal upon completion of a delay following a first edge of the sync signal, wherein the delay is determined by the sense signal, and for generating a second state signal in response to a second edge, opposite from the first edge, of the sync signal;

a grounded totem pole driver, having a top output transistor and a bottom output transistor switched in response to the first and second state signals, to drive an output signal with the top output transistor on and the bottom output transistor off in response to the first state signal and to maintain a low impedance path through the bottom output transistor to ground with the top output transistor off in response to the second state signal until the first state signal is generated; and the switching device having the output, an input coupled to the voltage on the secondary winding and a control input coupled to the output signal of the grounded totem pole driver.

19. The secondary side post regulator of claim 18 wherein said programmable delay circuit comprises:

a current source that charges a capacitor in response to the first edge of said sync signal;

a discharge transistor activated in response to the second edge of said sync signal to discharge the capacitor to a discharged level;

an error amplifier connected to receive a reference signal and the sense signal corresponding to the voltage at the output of said switching device in order to produce an error control signal; and a comparator, connected to receive a voltage from the error control signal and a voltage signal from the capacitor, for generating the first state signal when the voltage signal on the capacitor rises above the voltage from the error control signal.

20. The secondary side post regulator of claim 19 wherein said programmable delay circuit further comprises a reset signal generator, coupled to the capacitor, for producing a reset signal when the capacitor has a voltage below a predetermined level and wherein said comparator generates the second state signal upon receiving the reset signal and a voltage signal on the capacitor below the voltage from the error control signal.

21. The secondary side post regulator of claim 19 wherein said comparator further includes an input connected in parallel with the error control signal, the input receiving a Voff signal above the discharged level of the capacitor in response to the second edge of said sync signal wherein said comparator generates the second state signal when the Voff signal is above the voltage signal on the capacitor.

22. The secondary side post regulator of claim 18 wherein said switching device comprises an FET having a drain, a gate and a source wherein the drain is the input coupled to the voltage on the secondary winding, the gate is the control input and the source is the output.

23. A secondary side post regulator comprising:

a conductive line for receiving a sync signal corresponding to a voltage on a secondary winding;

a programmable delay circuit, connected to receive a sense signal corresponding to a voltage at an output of a switching device, for generating a first state signal upon completion of a delay following an edge of the sync signal, wherein the delay is determined by the sense signal;

a reset signal generator arranged so as to produce a reset signal;

a latch circuit coupled to said reset signal generator and to said programmable delay circuit in order to latch the first state signal until the reset signal is received, wherein said programmable delay circuit generates a second state signal in response to the reset signal;

a totem pole driver, having a top output transistor and a bottom output transistor switched in response to the first and second state signals, to drive an output signal with the top output transistor on and the bottom output transistor off in response to the first state signal and to maintain a low impedance path through the bottom output transistor with the top output transistor off in response to the second state signal; and the switching device having the output; an input coupled to the voltage on the secondary winding and a control input coupled to the output signal of the totem pole driver.

24. The secondary side post regulator of claim 23 wherein said programmable delay circuit includes a current source for charging a capacitor to generate a ramp signal in response to the edge of the sync signal.

25. The secondary side post regulator of claim 24 wherein said reset signal generator produces the reset signal when the ramp signal is below a first predetermined level and the sync signal is below a second predetermined level.

26. The secondary side post regulator of claim 23 wherein said programmable delay circuit comprises:

a current source that charges a capacitor in response to the edge of said sync signal;

a discharge transistor for discharging the capacitor;

an error amplifier connected to receive a reference signal and the sense signal corresponding to the voltage at the output of said switching device in order to produce an error control signal;

a comparator, connected to receive a voltage from the error control signal and a voltage signal from the capacitor, for generating the first state signal when the voltage signal on the capacitor rises above the voltage from the error control signal.

27. The secondary side post regulator of claim 23 wherein said switching device comprises an FET having a drain, a gate and a source wherein the drain is the input coupled to the voltage on the secondary winding, the gate is the control input and the source is the output.

* * * * *